United States Patent [19]

Finger

[11] Patent Number: 4,460,870
[45] Date of Patent: Jul. 17, 1984

[54] QUIESCENT VOLTAGE SAMPLING BATTERY STATE OF CHARGE METER

[75] Inventor: Eugene P. Finger, Brewster, N.Y.

[73] Assignee: Curtis Instruments, Inc., Mt. Kisco, N.Y.

[21] Appl. No.: 286,271

[22] Filed: Jul. 23, 1981

[51] Int. Cl.³ .............................................. G01N 27/46
[52] U.S. Cl. ...................................... 324/429; 320/48; 340/636; 324/431
[58] Field of Search .............. 324/426, 428, 429, 431, 324/430, 434; 340/636; 320/48

[56] References Cited

U.S. PATENT DOCUMENTS

| | | | |
|---|---|---|---|
| 3,890,556 | 6/1975 | Melling et al. | 320/21 |
| 4,028,616 | 6/1977 | Stevens | 324/431 |
| 4,080,560 | 3/1978 | Abert | 324/429 |
| 4,193,025 | 3/1980 | Frailing et al. | 324/427 |
| 4,193,026 | 3/1980 | Finger et al. | 324/428 |
| 4,234,840 | 11/1980 | Konrad et al. | 320/48 |
| 4,322,685 | 3/1982 | Frailing et al. | 324/429 |

FOREIGN PATENT DOCUMENTS 2000596 2/1982 United Kingdom ................ 324/429

OTHER PUBLICATIONS

Paper No. 783201 (E)—Title: Unidirectional and Bidirectional Battery State-of-Charge Indicators and Charge Controllers—Date: 10/78, Author: E. P. Finger—Presented at: The Fifth International Electric Vehicle Symposium—Sponsored by: Electric Vehicle Council.

Primary Examiner—Michael J. Tokar
Assistant Examiner—Kevin D. O'Shea
Attorney, Agent, or Firm—Curtis Ailes

[57] ABSTRACT

State of charge is determined for a battery during a quiescent interval with substantially no current flow through the battery by determining the quiescent time interval since the last substantial current flow through the battery, taking a rapid measurement of the battery terminal voltage, and relating the combination of these two measurements to known battery open circuit voltage recovery characteristics.

33 Claims, 10 Drawing Figures

QUIESCENT VOLTAGE SAMPLING BATTERY STATE OF CHARGE METER

The present invention relates to systems for monitoring the condition of charge of an electric storage battery such as a lead acid battery under conditions of operation where current flow through the battery is interrupted from time to time.

BACKGROUND OF THE INVENTION

Many different approaches have been made to the problem of monitoring and indicating the discharge condition of electric storage batteries, especially in applications where the battery is first charged and then is used in the discharge mode for a considerable period of time, such as in a mobile vehicle, before it is again returned to the charger to be re-charged.

One valuable approach which has been made to this problem is by the use of an ampere-hour meter. Very accurate results have been obtained with such meters. However, accuracy is sometimes limited by the fact that the number of ampere hours obtainable from a battery depends very heavily upon the rate of discharge, fewer ampere hours being available when the battery is rapidly discharged. Furthermore, the ampere-hour meter approach requires insertion in the circuit of some means for measuring current, such as a current measuring shunt. That is not nearly so convenient as simply measuring the battery terminal voltage.

Various battery terminal voltage measurement systems have been employed for the purpose of monitoring battery discharge, with varying degrees of success. The present invention is essentially in this category.

One approach is simply to measure and read the instantaneous battery terminal voltage on a continuing basis. However, this requires interpretation, since the terminal voltage varies during operation of the apparatus powered by the battery, having a depressed value during loading, dependent upon the magnitude of the load.

Various unidirectional systems have been devised for detecting and registering downward excursions in battery voltage under load, as an indication of the discharge condition of the battery. Some of these have operated on the basis of recognition of a sustained under-voltage condition before any registration is made, and others are really under-voltage analyzers which recognize and register under-voltage conditions in a setting recognizing previously registered under-voltage conditions. Very accurate results have been obtained with such systems, especially when applied to apparatus having known patterns of loading, even where the loading is quite discontinuous, such as in the operation of industrial fork lift trucks. Examples of successful systems of this sort are disclosed in a prior U.S. Pat. No. 4,193,026 issued to Eugene P. Finger and Eugene A. Sands on Mar. 11, 1980 and assigned to the same assignee as the present application.

As previously indicated above, in connection with the discussion of ampere hour discharge condition monitoring systems, the ampere hour capacity of a battery and thus its discharge condition, depends very much upon the rate of discharge. Thus, for instance, if a particular battery is discharged at a rate which will result in full discharge condition being achieved (at a cell terminal voltage of 1.75 volts) in one hour, the battery may provide only 45 ampere hours. However, if the battery is discharged at a rate which will cause complete discharge in six hours, 100 ampere hours may be obtained from the battery.

Not only is the ampere hour output capacity of the battery related to the rate of discharge, but it has also been discovered that the ampere hour battery capacity is related to the integrated discharge rate where the loading of the battery is discontinuous. Thus, even though the battery may be very heavily loaded for short intervals, if it is allowed to "rest" on lighter loads or no loads between the intervals of heavy loading, the battery capacity is extended almost as though the battery had been more lightly loaded on a continuous basis. While the prior systems of undervoltage analyzers manage to deal with this situation reasonably satisfactorily, it is desired to provide even further improvement in the response of a voltage measurement battery discharge condition monitoring system under conditions of discontinuous loading.

One very simple departure from the unidirectional undervoltage analyzer which has been employed in the past is to simply provide a substantially instantaneous upward correction in the computed state of charge of the battery which follows any upward excursion of battery terminal voltage. The upward voltage excursion usually signifies an inactive condition of the battery, or possibly a regenerative braking charging condition of the battery. While the battery does tend to recover its capacity based upon the removal of load, or a regenerative charging condition, the unmodified upward excursion of the terminal voltage under such circumstances does not give an accurate result in terms of indicating a corrected computed state of charge of the battery. This is especially true in the case of the regenerative braking mode of operation in which the instantaneous battery terminal voltage may rise to very high levels, much higher than the steady state open circuit battery terminal voltage in the fully charged state of the battery. This is very misleading because the regenerative braking is often very brief, and involves a very small restoration of energy to the battery. Even in the case of upward voltage excursions merely occasioned by removal of load, the continuously measured instantaneous battery terminal voltage is not a good accurate measure of the battery state of charge. However, the principle that an upward excursion in battery terminal voltage does signal a change in the state of charge of the battery, when properly factored, is an important one. One approach in recognition of this principle is embodied in a copending patent application Ser. No. 223,041 for a "Battery State of Charge Indicator Operating on Bidirectional Integrations of Terminal Voltage" filed by the same inventor as the present application on Jan. 7, 1981 and assigned to the same assignee as the present application.

SUMMARY OF THE INVENTION

It has been recognized that one of the most accurate voltage measurements for indicating the battery state of charge is the stabilized open circuit battery terminal voltage. However, it typically takes several hours or days for the open circuit battery voltage to stabilize after each charge or discharge interval, so that the stabilized reading is simply not available to the operator of the battery powered apparatus without an impractical wait for the stabilized condition. Usually, the battery state of charge information is needed most while the battery is being discharged or charged, or immediately after a discharge or charge interval.

It is an object of the present invention to provide a new method and apparatus utilizing a battery terminal voltage measurement for determining the state of charge of the battery.

It is another object of the invention to provide a new battery state of charge indicating method and apparatus which may be based solely upon a measurement of battery terminal voltage under quiescent conditions.

It is another object of the present invention to provide a novel method and apparatus of measuring battery terminal voltage under quiescent battery conditions in such a way as to provide an accurate prediction of the ultimate stabilized open circuit battery terminal voltage as a basis for indicating the state of charge of the battery.

The present inventor has discovered that after an interval of current flow through a battery, either because of charging or discharging, the battery terminal voltage tends to adjust rapidly, during an initial brief interval after discontinuance of the current, to a voltage value which is substantially independent of the magnitude of the prior current flow through the battery, and which is substantially completely dependent upon the state of charge of the battery. However, from that point on, the terminal voltage value continues to change as a very predictable function of the elapsed time after current interruption, adjusting towards the ultimate stabilized open circuit voltage. This predictable time function of voltage recovery is substantially independent of the actual voltage level of the terminal voltage. The present invention takes advantage of this principle by taking at least one sample of the battery terminal voltage at a fixed time interval after the battery becomes quiescent, and after the battery is in the predictable time function voltage recovery to stabilized open circuit voltage.

In carrying out the invention, there is provided a method for indicating the state of charge of the batteries in an electrical power system of the type in which charged batteries are discharged to supply a load during a discharge cycle, and then recharged in a charge cycle before beginning a new discharge cycle, the discharge cycle including quiescent intervals, the method including the steps of detecting a quiescent condition with substantially no current flow through the battery, timing each quiescent condition for a predetermined interval of time, and then taking a measurement of the battery terminal voltage upon the completion of the time interval as an indication of the battery charge condition.

In carrying out the invention there may also be provided a battery state of charge indicator system for monitoring the condition of electrical storage batteries in an electrical power system of the type in which charged batteries are discharged during a discharge cycle to supply a variable load and then recharged in a charge cycle before beginning a new discharge cycle, the discharge cycle including a plurality of quiescent intervals, said indicator system including means for detecting the quiescent condition when there is substantially no current flow through the batteries, a timing means connected to said quiescent condition detecting means and operable to begin timing a predetermined interval each time the beginning of the quiescent condition is detected, said quiescent condition detecting means being operable to reset said timer upon the interruption of the quiescent condition, said quiescent condition detecting means being operable to cause said timing means to continue timing said interval while the quiescent condition continues until the timing of said interval is completed, a voltage sample and storage means connected to said timing means and arranged to be connected to measure the terminal voltage of at least one of the batteries in the power system being monitored, said timing means being operable upon the completion of the timing of said interval to actuate said sample and storage means, said sample and storage means being operable upon such actuation to take a measurement of the battery terminal voltage as an indication of the battery charge condition.

DESCRIPTION OF PREFERRED EMBODIMENTS

Figure 1:
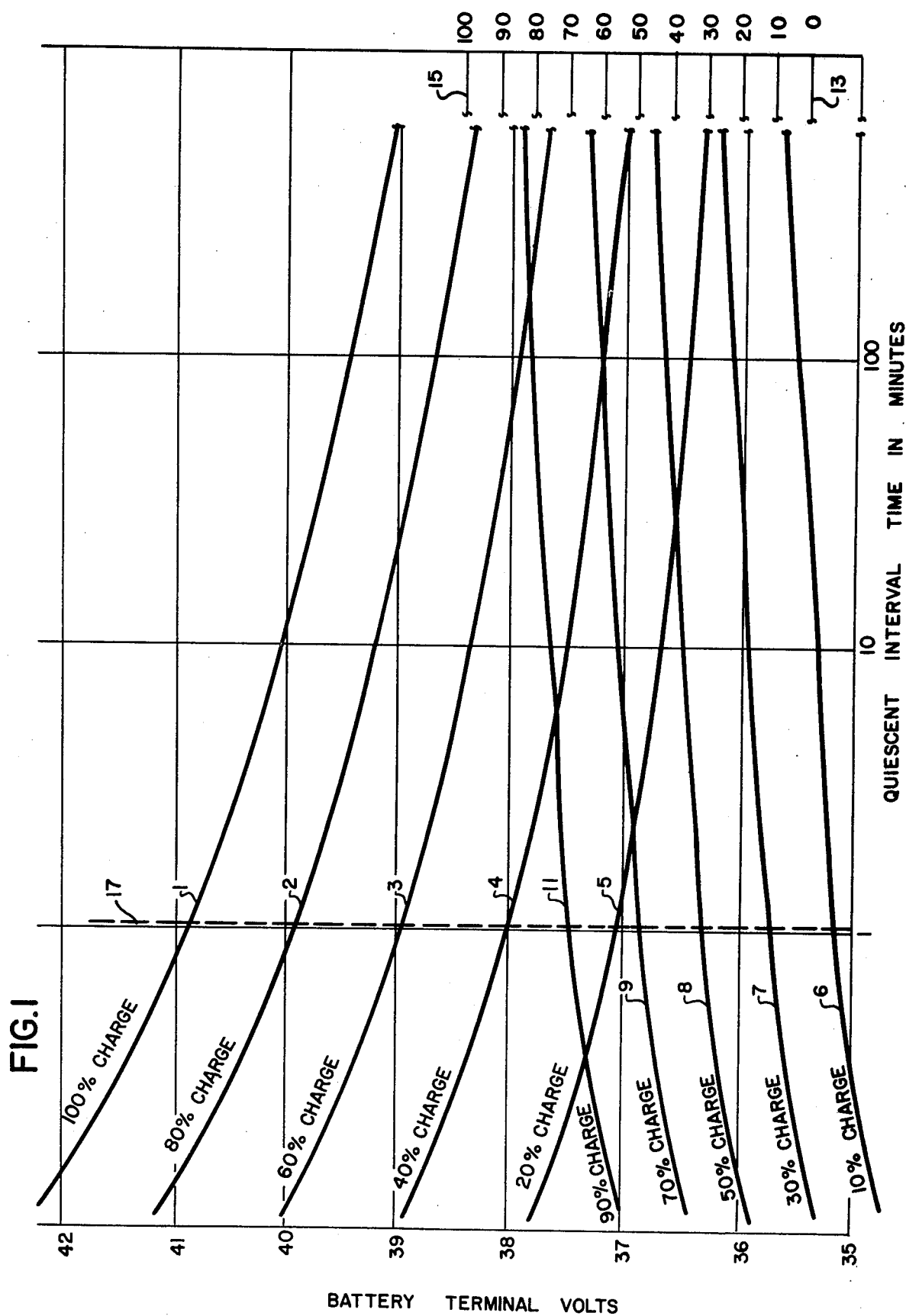
FIG. 1 shows typical plots of battery terminal voltage recovery curves versus time after termination of battery current at various states of charge, with an expanded voltage scale and a logarithmic time scale.

Referring more particularly to FIG. 1, there is shown two series of voltage curves plotted on an expanded vertical scale for nominal 36 volt battery systems. These curves are plotted on a logarithmic horizontal scale representing the time duration of the quiescent interval after termination of battery current. The upper set of curves, designated 1 through 5, which incline downwardly, represent battery open circuit voltage respectively at different states of charge versus time after termination of a charge operation. The lower set of curves designated 6 through 9 and 11, which incline upwardly, represent battery open circuit voltage respectively at different states of charge versus time after termination of a discharge operation.

Curve 1 represents the condition of 100% charge, and it is so marked. Curves 2, 3, 4, and 5 respectively represent 80% charge, 60% charge, 40% charge, and 20% charge states. Similarly, curves 6 through 9 and 11 respectively represent 10%, 30%, 50%, 70%, and 90% charge states, and are respectively so marked.

The curves represent voltage stabilization characteristics to be expected from a particular 800 ampere hour lead acid traction battery having 18 cells at a temperature of 25° C. The curves are typical of those to be expected from this battery type. For this battery, the ultimate stabilized open circuit voltage may be expressed as a function of battery charge to a very close approximation by the following expression:

Open circuit voltage = 35.46 + 0.288 P.

(Where P = the percent of full charge on the battery.)

This expression calls for a fully discharged stabilized open circuit voltage of 35.46, and a fully charged stabilized open circuit voltage of 38.34 volts. These values are respectively shown, for reference purposes, in FIG. 1 at the right margin of the drawing at 13 and 15. Stabilized open circuit voltages for intermediate charge states are indicated at 10% intervals between the extreme values at 13 and 15. These stabilized open circuit voltage values are not related to the horizontal time scale since the stabilized voltage values are not actually achieved until a time substantially beyond the time scale shown, even though the time scale is a logarithmic scale.

The curves of FIG. 1 are idealized to some extent, but they generally represent the character of actual data on actual batteries. In the earliest portions of the quiescent intervals, up to about one tenth of a second, the recovery voltage characteristic has been found to be very much dependent upon the magnitude of the prior battery current. However, it has been discovered that after about one tenth of a minute, and especially after about one minute, all of the curves become quite mathematically predictable and regular, and appear to be substantially independent of the magnitude of the current prior to commencement of the quiescent interval, as long as the current is in the medium to heavy load range. Thus, the curves are almost straight lines, as plotted on the horizontal logarithmic scale, and thus represent essentially logarithmic functions, or at least predictable exponential functions. Because of this, the curves represent a basis for accurate prediction of the ultimate steady state open circuit terminal voltage, and that prediction provides a basis for accurately indicating the state of charge of the battery. This prediction is particularly enhanced if battery terminal voltage is always measured in the same narrow time window at a fixed time interval after the commencement of quiescence. While other time intervals can be selected, a time interval of one minute has been found to be very useful, and that interval has been indicated in the drawing at 17 for the time window.

Figure 2:
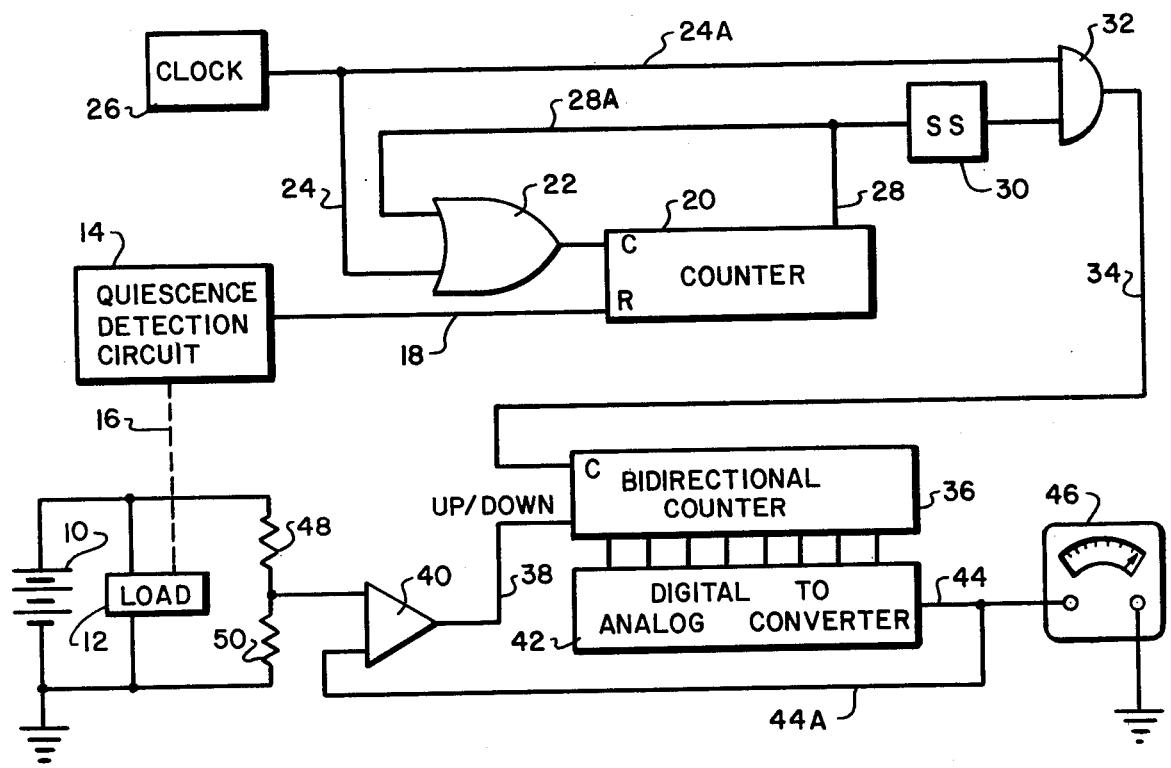
FIG. 2 is a schematic circuit diagram illustrating a preferred apparatus for carrying out the invention.

FIG. 2 is a schematic circuit representation of a circuit for embodying the system of the present invention, and for carrying out the method of the present invention. The battery for the power system is shown at 10, and connected to a load schematically shown at 12. A quiescence detection circuit 14 may be connected, as indicated at 16, to the load 12 to detect an inactive condition of the load. The quiescence detection circuit may also be referred to as an "activity" detector, or as an "off condition" detector. It is intended to detect the condition when there is substantially no current flow through the battery. A typical quiescence detection circuit is described more fully below in connection with FIG. 3. The output of the quiescence detection circuit 14, at connection 18, is connected to the reset input of a timing counter 20. Counter 20 is a digital counter which receives clock pulses on a clock input "C" through an OR gate 22 and a connection 24, from a system clock 26.

Whenever the quiescence detection circuit 14 detects the condition of inactivity (load off) the reset signal to the counter 20 on connection 18 is removed, permitting the counter to count up in order to time an interval before a voltage sample is to be taken. However, if the quiescence detection circuit detects activity at any time, a reset signal is applied at connection 18 to the reset input of counter 20, causing the counter to be reset and to remain in the reset condition until quiescence is again detected.

If the condition of quiescence continues long enough, the counter 20 counts up to a prescribed count corresponding to the time interval desired (such as 1 minute), causing an output signal to appear at the output connection 28. This signal is carried on the ancillary connection 28A back to the OR gate 22, causing the OR gate to remain "on" in a steady state on condition, causing the counter to stop counting. The output at connection 28 is also supplied to a single shot circuit 30 (a monostable multivibrator) to commence a voltage sampling operation for the purpose of taking and recording a voltage sample indicative of the terminal voltage of the battery 10.

The sampling operation is initiated by the single shot circuit 30 by enabling an AND gate 32 to supply clock pulses from the connection 24A through a connection 34 to the clock input C of a bidirectional binary counter 36. The bidirectional counter 36 counts up or down depending upon the polarity of the voltage applied to an up/down control input at connection 38 from a differential amplifier 40. The count stored in the bidirectional counter 36 is converted from a combination of digital values to an analog voltage by means of a digital to analog converter 42. That voltage appears at an output 44, which is connected to a voltmeter 46, and which is connected at 44A as one of the inputs to the differential amplifier 40. The other input to the differential amplifier 40 is taken from the midpoint of a voltage divider consisting of resistors 48 and 50 connected across the battery 10, and therefore providing a voltage proportional to the battery terminal voltage.

The sampling circuitry including the bidirectional counter 36 operates as follows: during the sampling interval as determined by the single shot circuit 30, clock pulses are provided to the bidirectional counter 36 on connection 34. If the two voltages applied to the respective inputs of the differential amplifier 40 are different, there will be an up or down signal on input connection 38 to the bidirectional counter 36, an up or down counting will occur until the voltage output from the digital to analog converter 42 at connection 44 is equal to the voltage output from the battery derived from the voltage divider 48-50, and that voltage will be displayed upon meter 46, to give the operator of the apparatus a visual indication representative of the battery terminal voltage during the sampling interval. The meter 46 is preferably marked and calibrated, and provided with an expanded scale, in order to accurately indicate the charge condition of the battery 10 based upon the measurement of the battery terminal voltage. In this manner, the voltage output at connection 44 is changed and updated at every sampling interval (sometimes referred to herein as a time window).

If the battery terminal voltage as measured at the voltage divider 48–50, is initially the same as the voltage output from the digital to analog converter 42 at connection 44 and 44A, the differential amplifier 40 will not provide either an up or down count signal to the bidirectional counter 36 and the indicator 46 will remain unchanged.

It is a very important principle of the invention that the so called time window is a rather limited interval of time which begins and ends at well defined moments to provide an output voltage sample to the meter 46 which accurately predicts the ultimate steady state no load battery voltage. Thus, in order to make this accurate prediction, it is important that the measurement be taken only after a well defined time interval after quiescence, as determined by the operation of the counter 20, and that the measurement be interrupted after a well defined interval as determined by the single shot circuit 30, so that battery voltage is sampled at a well defined time after current flow has occurred, and a time which is very consistent from one sampling measurement to another. Thus, the voltage is always taken at the same place on each voltage recovery curve, providing a consistency in the readings, and an accurate calibration of the system to accurately indicate the remaining charge on the battery in terms of a consistent prediction of the ultimate steady state open circuit voltage.

Figure 3:
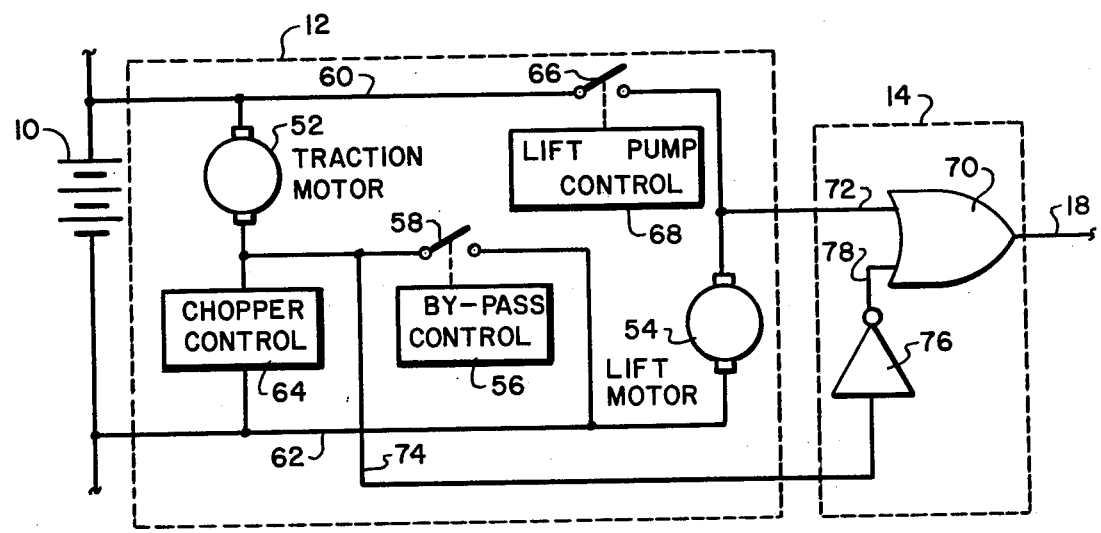
FIG. 3 is a schematic circuit diagram illustrating a quiescence detection circuit as applied to a battery driven forklift truck for use in the circuit of FIG. 2.

FIG. 3 is a more detailed schematic circuit of a typical preferred quiescence detection circuit 14 as applied to a particular load circuit 12 for the battery 10. The load circuit 12, as illustrated in FIG. 3, is typical of that of a battery powered forklift truck having a traction motor 52 and a lift motor 54. For full speed movement of the forklift truck, a bypass control 56 closes a direct circuit through contacts 58 for the traction motor 52 connecting the traction motor 52 directly to the battery 10 through the two main battery connections 60 and 62. When less than full speed is required of the forklift truck, a reduced current is applied to the traction motor 52 through a chopper control system 64 consisting of a combination of solid state switching devices such as silicon controlled rectifiers together with associated control circuitry. The lift motor 54 drives a hydraulic pump for a hydraulically controlled lift mechanism. Whenever pumping is required, the pump lift motor 54 is energized by the closure of contacts 66 by a lift pump control 68.

The quiescence detection circuit 14 (which may also be characterized as an activity detector) consists of an OR gate 70 which provides a logic one output signal at output connection 18 whenever either of the motors 52 or 54 is energized. When the lift motor 54 is energized by closure of switch 66, the resultant positive voltage at the upper terminal of lift motor 54 is sensed as a logic one by the OR gate 70 through the connection 72. Similarly, when the traction motor 52 is energized either through the chopper control 64, or through the bypass contacts 58, the resultant connection of the lower terminal of traction motor 52 to the main negative conductor 62 of the battery 10 is detected through a connection 74 and an inverter 76 and the input connection 78 to the OR gate 70. The negative voltage detected at connection 74 is recognized by the quiescence detector circuit as a logic zero signal which is inverted by the inverter 76 to a logic one signal on connection 78.

Thus, whenever there is activity for either of the motors 52 or 54, there is a resultant logic one signal supplied to the OR gate 70 on at least one of the input connections 72 and 78, causing a logic one output on connections 18. On the other hand, if neither of the motors is active, logic zeros are present at both of the inputs to OR gate 70, and a logic zero output is available at connection 18, indicating quiescence.

FIG. 3 illustrates but one of many different arrangements which may be employed to detect a quiescent or inactive condition of the battery load. Other methods and circuits for this purpose are discussed more fully below.

Figure 4:
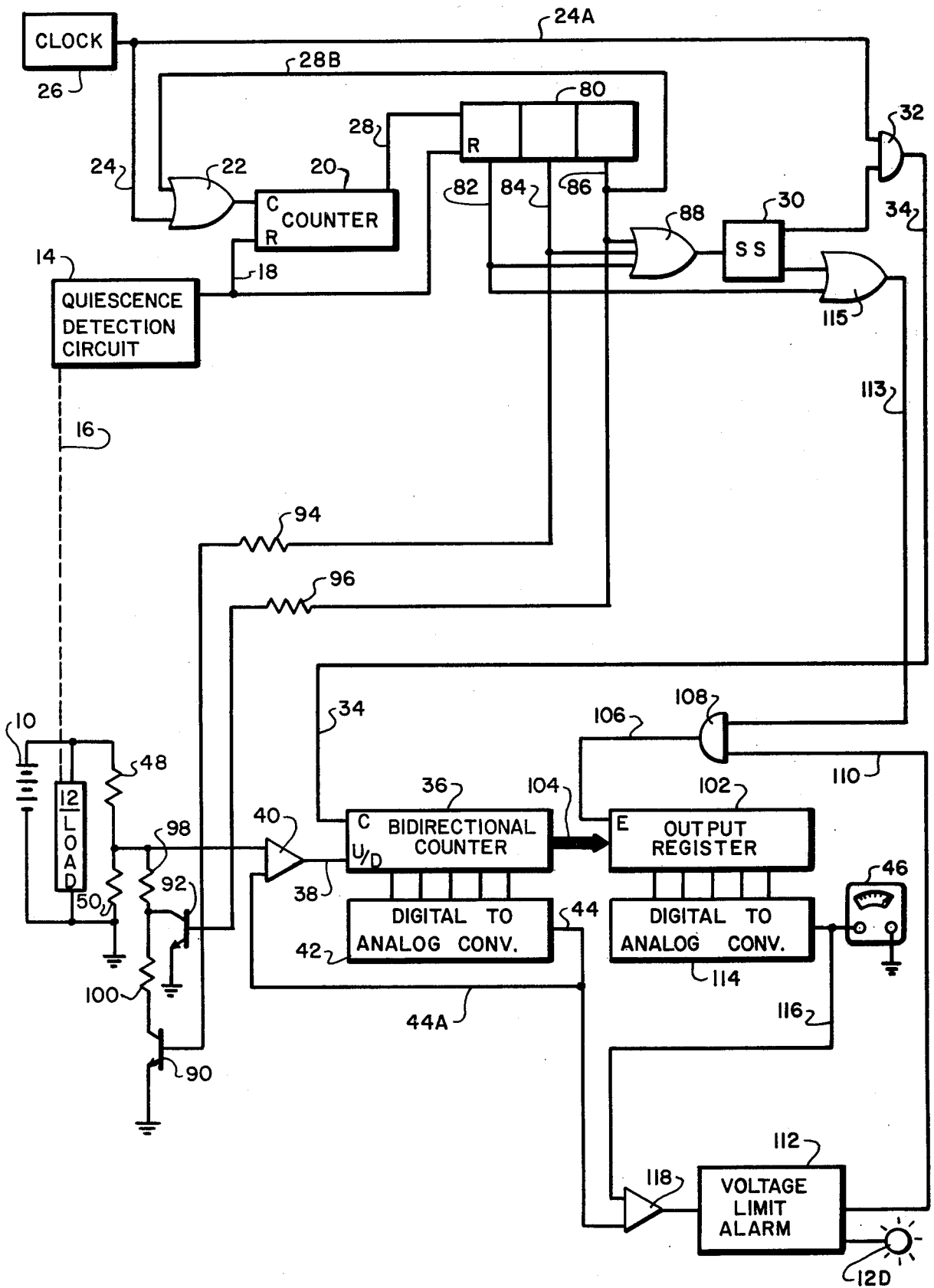
FIG. 4 is a schematic circuit diagram of a modified embodiment of the system of FIG. 2 which operates to take successive voltage samples at spaced time intervals.

FIG. 4 is a modification of the system of FIG. 2 which is adapted to take several voltage samples at periodic intervals after the initial time delay. In order to detect the presence of successive time sample intervals, a shift register 80 has been added to receive the output signal from counter 20 on line 28 upon the completion of each time interval determined by counter 20. The counter 20 continues to run after the completion of the initial interval, to provide a second and third timing interval. Each time a counter interval is completed, the signal output on connection 28 causes the shift register 80 to shift one position. Shift register 80 is designed so as to respond to the first output from counter 20 on connection 28 to shift a logic 1 into the first stage, and to provide a logic 1 output on the output connection 82. Upon the reception of the next input on connection 28, the logic 1 is shifted to the second stage of register 80, providing a logic 1 output on connection 82, while the output on connection 82 shifts back to logic 0. Similarly, upon receipt of the third input on connection 28, the logic 1 is shifted to the third stage, providing a logic 1 output on connection 86, while output 84 goes back to logic 0. The logic 1 on connection 86 is carried through the connection 28B back to the OR gate 22 at the clock input of counter 20 to stop the counter 20 by providing a steady logic 1 at the clock input to the counter. Thus, no further output signals will be emitted at connection 28 after the third sample is taken.

Any one of the sample initiation signals on connections 82, 84, and 86 will trigger the single shot circuit 30. This is accomplished by means of an OR gate 88 connected to receive each of the sample initiation signals, and operable in response thereto to provide an output to single shot circuit 30. For each sampling interval then, the single shot circuit 30 enables the AND gate 32, as previously described in connection with FIG. 2, providing clock input signals to the bidirectional counter 36 on connection 34. The bidirectional counter 36 then counts up or down in response to the up or down voltage control signal from a comparison amplifier 40 as it compares the battery terminal voltage measured across the voltage divider combination 48–50 with the output at 44 from the digital to analog converter 42 connected to the counter 36.

As explained above in connection with FIG. 1, the recovery of the battery terminal voltage upon the discontinuation of substantial load, and the initiation of quiescence, follows a very predictable exponential characteristic as a function of time after an initial brief interval during which the recovery of the terminal voltage of the battery is substantially dependent upon the amplitude of the prior current through the battery. The samples of terminal voltage in accordance with the present invention are thus taken after the prior-current amplitude-dependent range in the voltage recovery, and in the range which is substantially independent of the prior current amplitude. Since the recovery voltage in that second range is then an exponential function of time, taking the voltage sample at a fixed and predetermined interval after the beginning of quiescence, and in the range which is independent of prior current amplitude, provides a basis for predicting the ultimate steady state quiescent open circuit voltage, and thus providing a measurement of battery charge condition which is almost as accurate as the ultimate steady state open circuit voltage might be.

However, the accuracy of this determination depends very much upon selection of the exact time window during which the sample voltage is taken, since the terminal voltage continues to change as a time function of the quiescent interval. Accordingly, when subsequent voltage samples are also taken, it is necessary to compensate for the fact that the terminal voltage is continuing to change, since the open circuit voltage has a different value for each later sampling interval. In the present system, this voltage compensation for the subsequent sample time windows represented by the outputs at shift register outputs 84 and 86 is accomplished by means of switching transistors 90 and 92, each having base control electrodes which are connected to receive signals respectively from the time window outputs on connections 84 and 86 through the respective resistors 94 and 96 to place the resistors 98 and 100 in shunt with the voltage divider resistor 50, to thus lower the effective resistance of the lower branch of the voltage divider and to thus decrease the effective voltage outputs for the second and third samples to compensate for the continuing voltage recovery of the battery terminal voltage at the later sample window intervals.

When the transistors 90 and 92 are not switched on, they effectively do not exist as far as the voltage divider 48–50 is concerned, except for the high collector emitter impedance of each transistor. However, when the second sample window signal is available on connection 84, it operates through the circuit including resistor 94, and the base of transistor 90 to switch on transistor 90 and place the resistors 98 and 100 in series to ground across the voltage divider resistor 50 to thus appropriately reduce the sampled voltage at the second sample interval to correspond to the predicted increase in voltage due to the additional voltage recovery of the battery between the first sample time and the second sample time. Similarly, at the third sample time window, the signal on connection 86 is supplied through resistor 96 to the base electrode of transistor 92, connecting resistor 98 alone in shunt with voltage divider resistor 50. Since resistor 98 alone has less resistance than resistance 98 and 100 taken together in series, this lowers the voltage from the voltage divider 48–50 even more, to compensate for the still further recovery of the battery terminal voltage. The voltage compensation provided by the resistors 98 and 100 and the transistors 90 and 92 is preferably exactly tailored to provide substantially the same net voltage at the upper input to the comparison amplifier 40 for the three different samples, based upon the predicted battery terminal voltage recovery function which is expected from a battery which is in good normal operating condition. In such circumstances, not only are the successive samples in close correspondence with one another, but the later samples may represent slight improvements upon the prediction of the ultimate steady state open circuit voltage.

However, if there is a great discrepancy between successive samples, then that discrepancy is likely to indicate serious abnormalities in the battery, or in the battery connections, which should receive the attention of the operator. Accordingly, it is an important optional feature of this embodiment of the invention to provide for a comparison of the values of successive samples, and to provide an alarm indication whenever that comparison indicates a discrepancy between successive sample voltages which is beyond predetermined limits. In order to carry out this feature of the invention, a separate output register 102 is connected to the bidirectional counter 36 at 104. The output register 102 is operable to receive the contents of the bidirectional counter 36 upon receipt of an enablement signal on connection 106 from an AND gate 108. An input 110 to AND gate 108 is normally enabled by a signal from a voltage limit alarm circuit 112. Accordingly, the operation of the AND gate 108 is normally controlled by a signal on an input 113 from an OR gate 115. OR gate 115 is connected to receive and respond to the reset output of the single shot circuit 30.

The single shot circuit 30 is essentially a monostable multivibrator circuit. Accordingly, the reset output of that circuit is at logic 0 when the single shot is active, but at logic 1 when the single shot circuit 30 is inactive at the end of the single shot interval (and continuing until the next single shot input pulse). Since disablement of AND gate 108 is not desired when the single shot circuit 30 is operated in response to the first time window pulse on connection 82, the signal from 82 is connected as a second input to OR gate 115 to thus provide an output to connection 113 which maintains the logic 1 on connection 113 while single shot 30 would normally remove that logic 1 in response to the first time window pulse.

With the single shot circuit 30 in the reset state, or with 82 active AND gate 108 is enabled, and the output register 102 continuously stores the same number which is stored in the bidirectional counter 36. That number is converted by a digital to analog converter 114 to a voltage signal which is supplied to the indicating meter 46. That voltage is also supplied through a connection 116 to a voltage comparison amplifier 118. The other input to the voltage comparison amplifier 118 is from the output connection 44 of the digital to analog converter 42 which indicates the value stored in the bidirectional counter 36. The output of the comparision amplifier 118 is connected to the voltage limit alarm circuit 112.

During the second and third voltage sample window intervals, the activation of single shot circuit 30, in the absence of a signal from 82 to OR gate 115 provides a logic 0 at connection 113, thus disabling gate 108, and permitting the output register 102 to remain at the last preceding measurement value, while the new sample voltage is stored in the bidirectional counter 36. Accordingly, under those circumstances, there may be different voltages at the outputs of the converters 42 and 114 for a comparison by the comparison amplifier 118.

Voltage limit alarm circuit 112 is operable to detect an absolute voltage difference on the output of amplifier 118 which is beyond a predetermined limit. If such an out-of-limit voltage difference is detected, the voltage limit alarm circuit 112 lights a lamp 120, or provides an audible alarm. The voltage limit alarm circuit 112 also, under those circumstances, removes the enabling signal on connection 110 to the AND gate 108 to prevent the transfer of information from the bidirectional counter 36 to the output register 102 upon reset of single shot circuit 30.

It will be understood that the function of the comparison amplifier 118 and the voltage limit alarm 112 may be carried out by a digital numerical comparison of the outputs of counter 36 and register 102. The indicator 46 may also be a digital read-out device operating directly from the numerical output of register 102 so as to eliminate the need for digital to analog converter 114.

Upon receipt of the first sample time signal on connection 82, that signal is supplied to OR gate 115 to maintain the enablement of AND gate 108 at connection 113 even though single shot circuit 30 would otherwise remove such enablement during the sampling interval. Thus, AND gate 108 continues to be enabled, and the output register continuously registers the same number which is stored in the bidirectional 36.

However, when the second sample window signal appears at connection 84, the output at 82 is at logic zero, and the reset output of single shot circuit 30 goes to logic 0 so that OR gate 115 puts a logic 0 on connection 113 to disable the AND gate 108. Thus, the output register 102 continues to store and register the value last transferred to that register from the bidirectional counter 36 before the set operation of the single shot circuit 30 signaling the beginning of the second sample window interval. Accordingly, the output register 102 continues to store a value corresponding to the sample voltage taken at the first sample. A voltage corresponding to that stored number is supplied through the digital to analog converter 114 to the meter 46, and through connection 116 to the comparison amplifier 118. Meanwhile, a number corresponding to the second sample voltage value is stored in the bidirectional counter 36 through the operation of the comparison amplifier 40 as previously described in connection with FIG. 2. A voltage corresponding to that number is available on connection 44 from the digital to analog converter 42 which is connected to the comparison amplifier 118.

If the two voltages are beyond a predetermined limit, as determined from the output of amplifier 118 by the voltage limit alarm circuit 112, the lamp 120 is lit, and the enablement signal on connection 110 to the AND gate 108 is removed. Accordingly, at the end of the sample window interval, when the single shot circuit 30 resets, the gate 108 is no longer enabled, and no transfer is made of the number stored in the bidirectional counter 36 to the output register 102. The operation is exactly the same in comparing the second voltage sample with the third voltage sample when the sample window signal appears on connection 86. Thus, if the comparison between the first and second samples, or the comparison between the second and third samples is out of limits, the last previous sample continues to be stored in the output register 102 and is indicated on the meter 46, and no transfer of the new sample voltage value is made from the counter 36 to the register 102. Also, the alarm lamp 120, or other alarm, is energized to indicate to the operator that there may be serious trouble with the batteries or the battery connections because of the inconsistencies in the voltage readings.

While the embodiment of FIG. 4 has been described in terms of taking just three voltage samples at spaced time intervals, it will be obvious that the same principles could be applied to continue to take more than three samples, up to any desired number. Furthermore, the samples need not be taken at uniform time intervals, as long as the anticipated voltage changes to each of the timed intervals are properly compensated. It is apparent also that with very little further modification, the circuit of FIG. 4 can be changed to permit a continuous sampling of the terminal voltage after the initial timed interval, if accompanied by continuous compensation for the changing of the terminal voltage with time.

Figure 5:
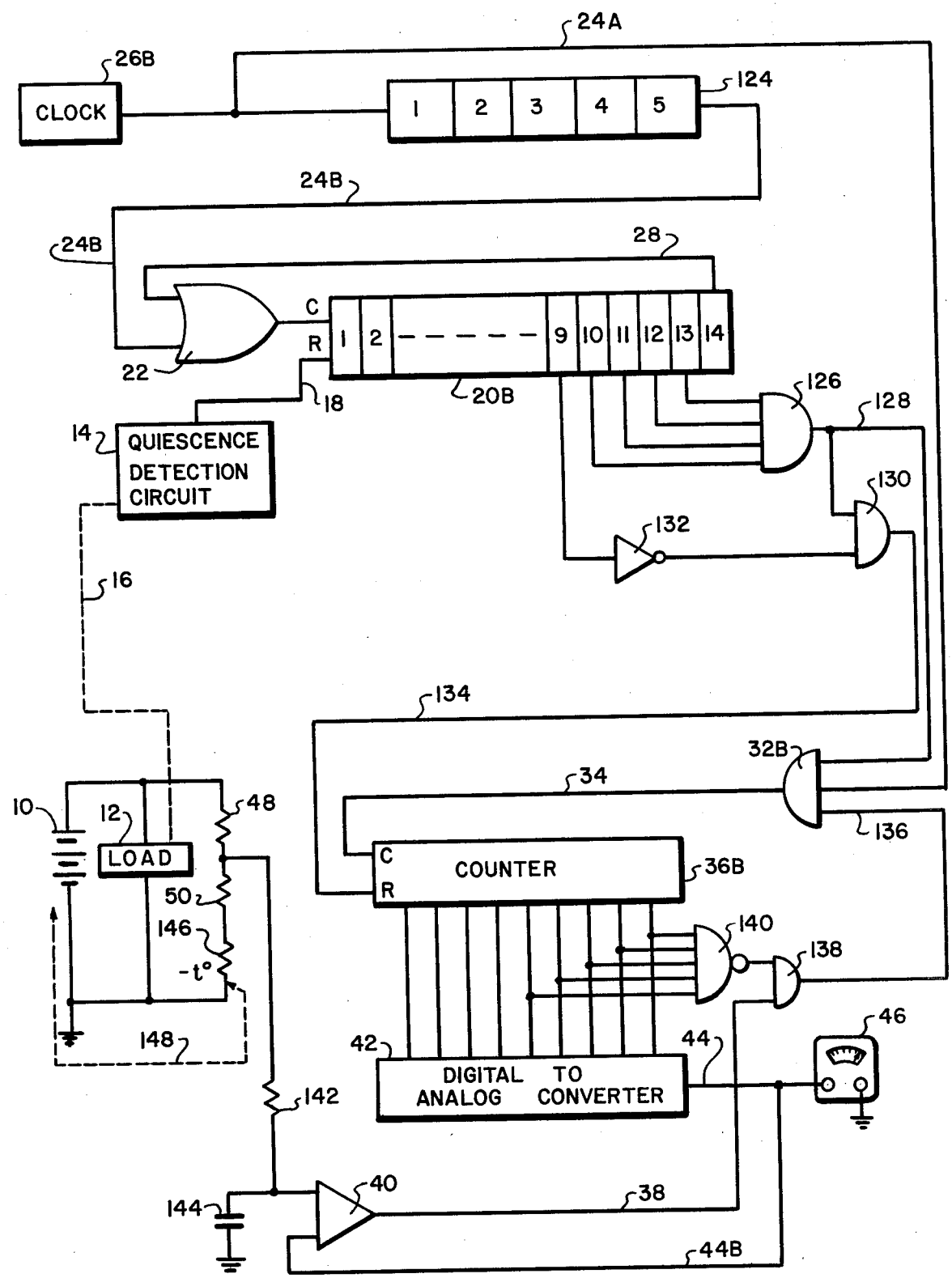
FIG. 5 is a schematic circuit diagram of another modified embodiment of the system of FIG. 2 which includes a number of alternative features including temperature compensation.

FIG. 5 is an alternative embodiment of the system of the invention as previously described in connection with FIG. 2. FIG. 5 will be described principally in terms of the differences from FIG. 2. First, two different clock rates are supplied respectively to the counters 20B and 36B in the FIG. 5 embodiment. These two different clock rates are both derived from the system clock 26B. Clock 26B operates thirty-two times as fast as the clock 26 of FIG. 2, and the fast clock pulses are supplied directly through connection 24A and the AND gate 32B to the counter 36B. However, the pulses from clock 26B are supplied through a frequency divider counter 124 and the connection 24B to the count input of the counter 20B. Thus, the frequency of the clock pulses supplied to the counter 20B is reduced by the frequency division accomplished by the counter 124. The reason for this frequency difference is that, while it is necessary to have the counter 20B operate relatively slowly to time out the exact quiescent interval before the time window is opened, once the time window is opened, it is desirable to operate the counter 36B at a relatively high rate in order to quickly capture the sample voltage reading, before the quiescent interval is interrupted.

Another major difference in the FIG. 5 embodiment is that the single shot circuit 30 has been eliminated, and the "on" interval of the time window is determined primarily by an AND logic gate 126 which is connected to receive and respond to a number of the counter stage outputs of counter 20B. As shown, AND gate 126 is connected to respond to the concurrent presence of outputs on binary stages 10, 11, 12, and 13 of counter 20B. As counter 20B counts upwardly, operating as a binary counter, the first concurrence of outputs on these four stages corresponds to a decimal count of 7,680. The output of AND gate 126 is then supplied on a connection 128 as one of the gating inputs for clock pulses at AND gate 32B.

The output on connection 128 is also supplied as one of the inputs to an AND gate 130. The other input to AND gate 130 is supplied from the ninth counter stage of counter 20B through an inverter circuit 132. When the count of 7,680 is achieved, causing the first output from AND gate 126, a digital 1 output is not present from stage 9, so that the inverter 132 provides a logic 1 input to AND gate 130, and thus an output is supplied by AND gate 130 through a connection 134 to the reset input of counter 36B. Counter 36B is of the type which can be reset to a selected value other than value zero, and the value to which the counter is set in this case corresponds to the lowest voltage value ever anticipated from the batteries 10 in the completely discharged condition. The counter then later counts up to a value corresponding to the actual battery terminal voltage.

As soon as the counter 20B achieves the count corresponding to decimal number 7,936, a binary 1 output is available at the ninth counter stage output, which operates through inverter 132 to disable AND gate 130, thus removing the reset signal from counter 36B. The clock pulses gated through gate 32B on connection 34 to the clock input of counter 36B are then effective to cause the counter to count up. This assumes that there is also an enabling signal on the third input 136 to AND gate 32B. Assuming the enablement signal at connection 136 continues for a considerable period of time, AND gate 32B is disabled by the removal of the signal on connection 128 when the counter 20B counts up to the decimal value 8,192, at which time the outputs of counter stages 10, 11, 12, and 13 all go to binary zero, and an output appears on counter stage 14 at connection 28 which disables the clock input at OR gate 22, as previously described in connection with FIG. 2. Thus, the time window is closed at the time determined by that event.

However, it is anticipated that the upward counting by counter 36B will be terminated sooner than the termination of the enablement signal on connection 28 by the removal of the enablement signal on connection 136. The enablement signal on connection 136 is supplied through an AND gate 138. One of the inputs to AND gate 138 is from a NAND gate 140 which is operable when counter 36B is reset to provide a continuous logic 1 input to AND gate 138. The other input to AND gate 138 is from the output of the comparison amplifier 40 on connection 38. Near the start of the time window, when the counter 36B is reset to the lowest anticipated value for the measured battery terminal voltage, the digital to analog converter 42 will indicate a low voltage at connection 44B to the comparison amplifier 40. Accordingly, since the battery voltage will normally be higher than the minimum value, there will be a definite output voltage difference indicated on connection 38 to AND gate 138, thus enabling AND gate 138 and enabling AND gate 32B to permit the clock pulses to count the counter 36B upward. However, as soon as counter 36B counts up to a value corresponding to the actual battery voltage being measured by the comparison carried out by the comparison amplifier 40, the output voltage on connection 38 from amplifier 40 goes to 0, the AND gate 138 is disabled, and counter 36B is stopped because it correctly indicates the battery terminal voltage in terms of the output from the digital to analog converter 42. This all normally occurs long before the "time window" is "closed" by the operation of AND gate 126.

However, if the battery terminal voltage is unusually high for some reason, or if the system malfunctions to indicate an unusually high voltage, NAND gate 140 is operable to stop the upward count of counter 36B at a maximum value corresponding to the full scale reading of meter 46. Thus, the system is provided with an arbitrary maximum reading as a safeguard. The NAND gate 140 accomplishes this by detecting the concurrence of digital 1 outputs on all of the five highest order outputs of counter 36B to then provide a logic 0 to AND gate 138.

Once the quiescent interval has been timed out, and the time window has been opened, it is very desirable that the voltage measurement be successfully completed so that the meter 46 will correctly indicate the state of charge of the battery, even though the quiescent condition may end while the measurement is being taken. This is one of the reasons for the use of the fast clock on counter 36B, which operates substantially faster than the clock on counter 20B. As a further precaution, a low pass filter consisting of resistor 142 and capacitor 144 is preferably provided at the battery voltage measurement input of the comparison amplifier 40. This low pass filter is highly resistant to any sudden change in the battery terminal voltage, which might be occasioned by the reapplication of load to the battery 10. Generally, the time constant of the filter is long enough so that the voltage measurement carried out by the resetting and subsequent counting up of the counter 36B can be completed with substantially full accuracy, even though load may be reapplied to the battery immediately after the counter 36B is reset.

Another alternative, not illustrated, is to provide a separate output register, such as register 102 in FIG. 4, and to permit transfer of the new update reading to the output register only if quiescence continues to the end of the counting up of the counter 36.

It is a particularly important alternative feature of the present invention to provide for battery temperature compensation of the battery voltage measurement. This is important because, at a given battery state of charge, the battery terminal voltage varies as a function of temperature, usually increasing at higher temperatures and decreasing at lower temperatures. Even in battery systems whose stabilized open circuit voltage is substantially temperature independent, the loaded and recovery voltage is usually temperature dependent. Accordingly, in order to obtain an accurate state of charge reading on the basis of a measurement of battery terminal voltage, it is necessary to compensate for battery temperature unless no substantial temperature variations are expected. In the present embodiment of the invention, this is accomplished by providing a temperature responsive resistor 146, which may be a thermistor, in series with the voltage divider network resistor 50. The thermistor 146 has a negative temperature resistance coefficient. Accordingly, if the temperature of the battery decreases, the resistance of thermistor 146 increases, thus increasing the voltage provided by voltage divider 48–50 to comparison amplifier 40, and thus compensating for the reduction of battery terminal voltage under load occasioned by the lowering of the temperature. Increase in the temperature causes a reverse operation and reverse compensation. The dotted line 148 terminated with arrows and extending between the battery 10 and the thermistor 146 is intended to indicate a thermal coupling between the two. Preferably, the thermistor is actually attached to the case of the battery 10, or immersed in the electrolyte of one of the cells (within a suitable insulated casing), or otherwise thermally coupled closely to the battery. However, sufficient, though imperfect, temperature compensation may be obtained by simply having the thermistor detect the same ambient air temperature to which the battery is subjected.

Figure 6:
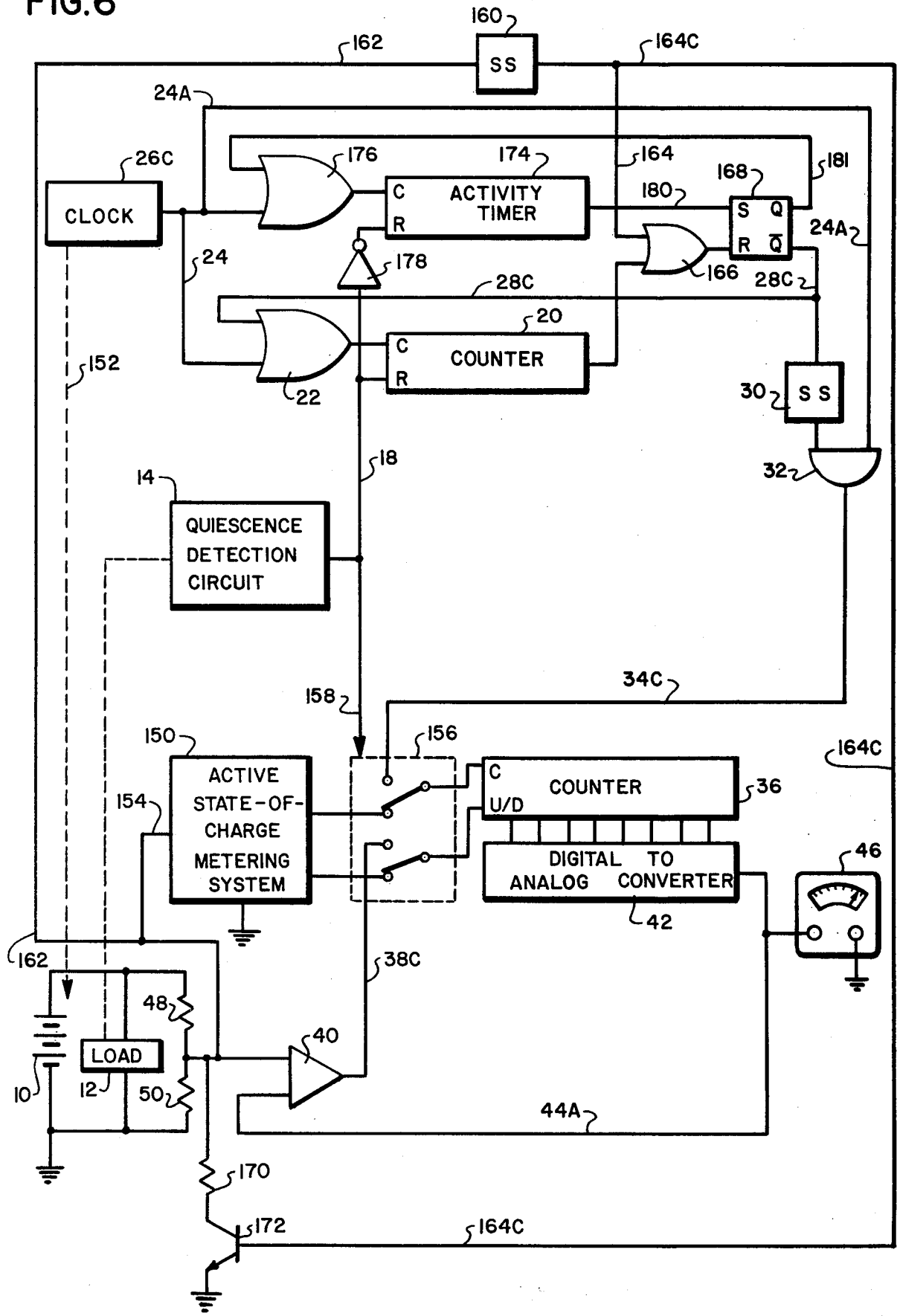
FIG. 6 is a schematic circuit diagram of still another modified embodiment of the system of FIG. 2 which includes a number of alternative features including a minimum duration of activity timer.

FIG. 6 is another modification of the system of FIG. 2 in which a number of optional features have been added, including temperature compensation by modification of the frequency of the system clock 26C, combination of the quiescence state of charge system of the present invention with an active state of charge metering system 150, provision for initial registration of the state of charge upon the initial connection of the battery 10 to the system, and addition of a further constraint on the quiescent voltage measurement state of charge metering system in which there must be a minimum interval of activity before a quiescent interval voltage measurement will be taken as a valid quiescent measurement.

In connection with FIG. 5, it was explained that temperature compensation is very important, particularly if substantial variation in battery temperature is expected. FIG. 6 illustrates an alternative method for temperature compensation in which the system clock 26C includes a thermal coupling to the battery 10 schematically indicated by the dotted line 152, and means is provided within the clock to vary the clock frequency in response to variations in temperature. The variation in clock frequency varies the quiescent interval before the time window is opened so as to take the sample voltage at a different place on the battery voltage recovery curve dependent upon temperature. Since the voltage recovery curve is constantly changing, this is an effective way of providing for a variation in the voltage measurement in response to temperature variation. If the temperature is reduced, the terminal voltage for a given state of charge will be at a lower value and the clock frequency will be reduced so as to provide for a longer quiescent interval, and a greater voltage recovery before the voltage sample is taken. Conversely, if the temperature rises, the clock frequency increases to take the measurement after a shorter quiescent interval.

It is one of the alternative features of the present invention that it can be employed in combination with an active state of charge metering system, as indicated at 150 in FIG. 6. The active state of charge metering system may be another battery terminal voltage responsive system such as one of the systems illustrated in a prior U.S. Pat. No. 4,193,026 issued Mar. 11, 1980 to Eugene P. Finger and Eugene A. Sands, and assigned to Curtis Instruments, Inc. of Mt. Kisco, N.Y. The counter 36 and the digital to analog converter 42 and the meter 46 may be common to the quiescent state of charge metering system and to the active state of charge metering system. The active state of charge metering system 150 is connected to detect the terminal voltage of battery 10, as indicated by connection 154, and is connected to control the operation of the counter 36 through a double pole switching device 156 which is controllable as schematically indicated at 158 by the quiescence detection circuit 14. Thus, when the battery 10 is in the active state, as detected by the quiescence detection circuit 14, the two switch levers of the switching device 156 are in the position shown to connect the active state of charge metering system 150 to the inputs of counter 36. Additional connections (not shown) may be required from the active state of charge metering system 150 to the counter 36.

When quiescence is detected by circuit 14, the switching device 156 is activated to move the switch levers to the upper contacts, disconnecting the counter 36 from the active state of charge metering system 150 and connecting the counter inputs respectively to conductor 34C and conductor 38C. The up-down operation of counter 36 is then controlled by the signal on connection 38C from comparison amplifier 40 as previously described in connection with FIG. 2. Also, clock pulses are available on connection 34C to change the count in the counter 36 whenever the time window is opened after the appropriate interval of quiescence.

If the batteries 10 have been disconnected for any reason, such as for charging, or for replacement, it is desirable that the system should be initially set to indicate the battery state of charge based upon the open circuit terminal voltage, regardless of whether or not there is an initial quiescent interval. In accordance with an alternative feature of the FIG. 6 embodiment, this problem is taken care of by means of a single shot circuit 160 shown at the top of the drawing, which is connected at 162 to detect battery terminal voltage, and to thus respond to the initial connection of battery 10 if it has been removed and reconnected to the circuit. The single shot circuit 160 is operable to emit an initial logic 1 output signal which continues for a timed interval which is generally comparable to, and preferably a little longer than, the interval provided by the single shot circuit 30. The output is supplied through a connection 164 to an OR gate 166, causing OR gate 166 to supply a reset signal to a flip-flop 168. The resetting of the flip-flop 168 causes an output to appear at connection 28C, which is the input connection to the single shot circuit 30 which initiates the time window interval for actuation of the counter 36. Presumably the load 12 is not activated immediately after connection of the battery in the circuit so that the quiescence detection circuit 14 is operable to switch the switch device 156 for quiescent operation. That is, the switch levers of switching device 156 are in the upper position for the quiescent state of charge meter operation.

The logic 1 output from flip-flop 168 on connection 28C is also connected as one of the inputs to OR gate 22, and the steady state logic 1 prevents the registration of clock pulses by the counter 20, even though the quiescent detection circuit 14 has removed the reset input to that counter.

There is one problem about this start-up actuation of the quiescent state of charge metering system in that the battery 10 is not in a dynamic voltage recovery phase, as it usually is at the fixed time window interval. This means, basically, that the measured battery terminal voltage (without modification) will be higher than it should normally be for a given state of charge. Accordingly, this problem is overcome by providing a shunt circuit for the lower branch 50 of the voltage divider 48-50 which is activated from the single shot circuit 160. The shunt circuit consists of a resistor 170 which is connectable to ground through the collector-emitter electrodes of a transistor 172, the transistor being switched to the conductive state by a signal to its base electrode from the connection 164C, which is a branch output from single shot circuit 160. Accordingly, the voltage measurement circuit is recalibrated by the operation of transistor 172 by the single shot circuit 160 during the initial start up voltage reading interval.

After the initial start-up interval operation of single shot circuit 160, that circuit is no longer effective, and subsequent operations of the system are not further effected by the presence of the single shot circuit 160.

The operation of the counter 20, and the interconnected circuit components is substantially the same in FIG. 6 as it was as described in FIG. 2. One of the main differences is the interposition of the OR gate 166 and the flip-flop 168 between the output of the counter and the connection 28C to the single shot circuit 30 and to the OR gate 22. With the features of FIG. 6, as thus far described, the flip-flop 168 would not be required, and the output of OR gate 166 could be connected directly to connection 28C. Thus, the single shot circuit 30, and the effective inhibit of OR gate 22 can be accomplished either in the normal manner by the signal output from counter 20, or in the start up mode by the signal from single shot circuit 160.

The flip-flop circuit 168 is provided for a special purpose in connection with the detection of a minimum interval of activity prior to quiescent state of charge metering, as will now be described in more detail.

The quiescent state of charge metering system is most accurate when the battery has been subjected to a current carrying condition for a sufficient time to cause the battery to change, in terms of terminal voltage, in the manner normally associated with a continuation of the current carrying condition. Thus, if the battery is loaded, the terminal voltage decreases in response to the loading. If the load is applied for only an instant, the battery terminal voltage does not change appreciably, and accordingly, the recovery of the dynamic recovery voltage recovery curve is untypical and does not comply exactly with the curves given in FIG. 1, for instance. In order to overcome this difficulty, it is desirable to require that there must be a minimum of interval of activity (battery current) before a quiescent interval will be recognized to be one which can result in a voltage measurement by the system. This is another one of the alternative features presented in FIG. 6.

For accomplishing the minimum interval of activity detection function, not only is there provided the flip-flop circuit 168, but also an activity timer 174, an OR gate 176, and an inverter circuit 178. The activity timer 174 is preferably simply another digital counter, which is connected through the OR gate 176 to the system clock 26C. The reset input of the activity timer 174 is connected through the inverter 178 to the quiescence detection circuit output 18. Thus, whenever there is activity, as detected by the quiescence detection circuit, the reset of activity timer 174 is released, and clock pulses received through OR gate 176 cause the timer 174 to count up. If the activity continues long enough, the timer 174 times out and provides an output at 180 to the set input of flp-flop 168, to put that flip-flop into the set state. The resultant output at 181 puts a steady state logic 1 on the upper input of OR gate 176, stopping further clock inputs to the activity timer 174.

The interaction of the operation of the activity timer 174 and the quiescent interval timer counter 20 is now described more fully. Upon initial start up of the system by reconnection of the battery 10 to the system, the single shot circuit 160 operates through OR gate 166, as previously mentioned, to reset flip-flop 168. As long as flip-flop 168 remains in the reset condition, the logic 1 output is maintained on connection 28C, which maintains a steady state logic 1 on the upper input of OR gate 22 so that the quiescence counter 20 is inhibited from operating, even though the quiescence detection circuit 14 detects quiescence and removes the reset signal input to counter 20. However, with flip-flop circuit 168 in the reset state, there is no corresponding inhibition of the activity timer counter 174. Accordingly, whenever activity is detected, and the reset input is removed from the activity timer counter 174, that timer counts up. If the activity continues long enough, without interruption, it ultimately causes the setting of flip-flop 168. That puts a steady logic 1 input from the Q output of the flip-flop 168 onto the upper input of OR gate 176, which inhibits further operation of the activity timer 174, as long as flip-flop 168 remains in the set state. However, the shift in the state of flip-flop 168 removes the logic 1 signal from connection 28C to thereby remove the inhibit from counter 20 so that, whenever a quiescent condition is later detected, counter 20 can count up to provide the normal timing interval till the time window opens to permit the voltage measurement. Thus, the activity timer 174, and the associated controls including flip-flop 168, impose the control condition that no quiescent state of charge measurement is made until there is the minimum interval of uninterrupted activity followed by a fixed quiescent interval. If the activity is interrupted before the activity timer 174 times out, the timer is reset. A delay may be provided in the reset of the activity timer 174 to accommodate for brief activity interruptions which do not seriously affect the achievement of a voltage condition typical of sustained activity. Preferably, some means (not shown) is provided for interrupting advancement of the activity timer during interruption.

While not shown, means may also preferably be provided for recommencing the activity timer cycle if the quiescent interval counter 20 is interrupted before the end of the quiescent period. Thus, a full interval of activity must again be achieved before a quiescent voltage reading can be taken.

Figure 7:
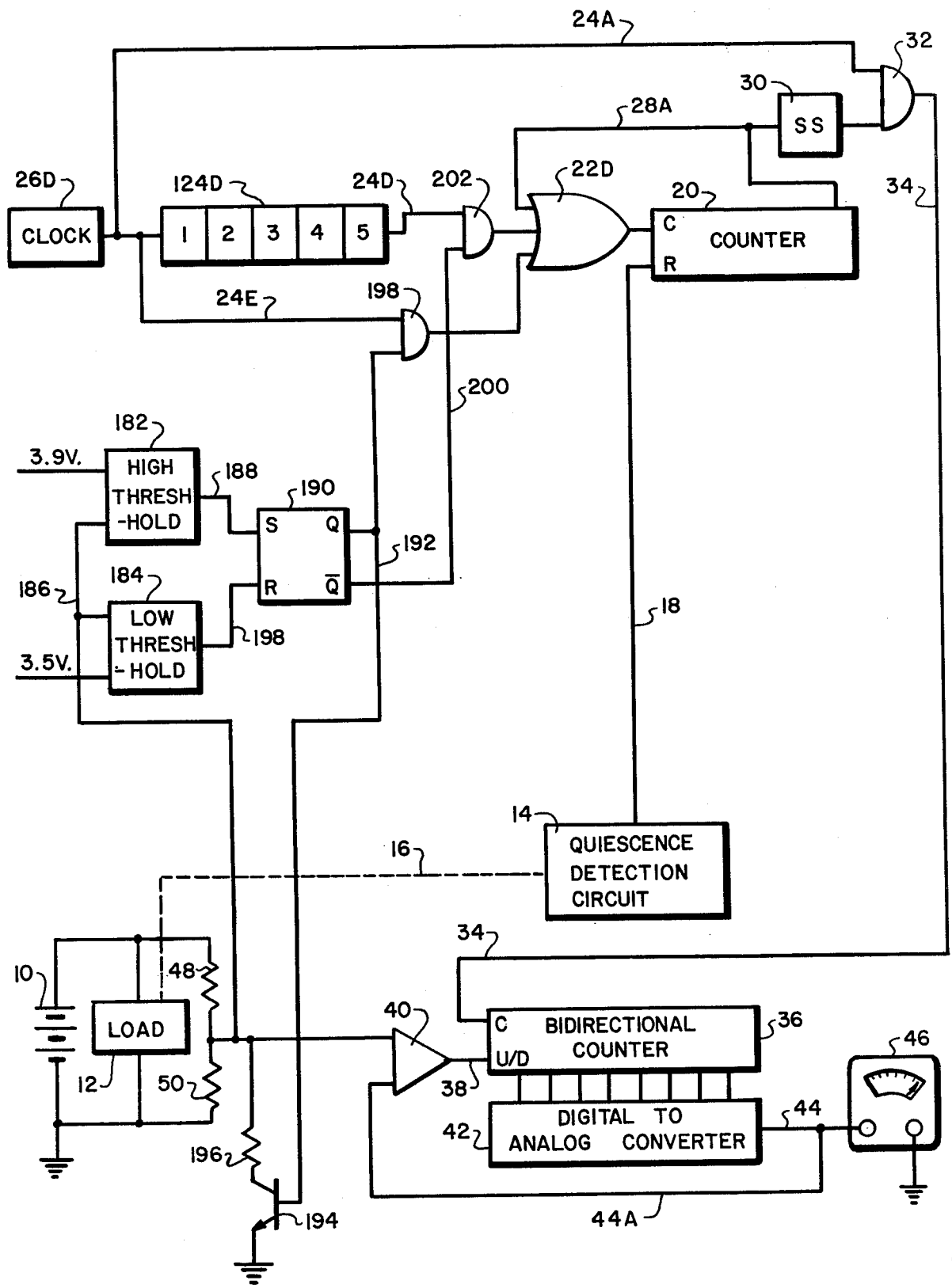
FIG. 7 is a schematic circuit diagram of a modification of the embodiment of the system of FIG. 2 which accommodates for voltage measurements to be taken after a charge operation on the battery as well as after a discharge operation by the battery.

FIG. 7 shows still another modification of the system of FIG. 2 which is capable of detecting and dealing with quiescence after charge, as well as quiescence after discharge. For the purpose of distinguishing between the two, two voltage threshold circuits 182 and 184 are both connected at 186 to respond to the battery terminal voltage as measured by the voltage divider 48–50. Assuming that the voltage divider 48–50 provides a ten to one voltage reduction, the high threshold circuit 182 is operable to respond to a measured voltage of 3.9 volts or higher, corresponding to a battery terminal voltage of 39 volts. Under the same conditions, the low threshold circuit 184 is operable to respond to 3.5 volts or lower, corresponding to 35 volts actual terminal voltage. The threshold voltages of 3.9 volts and 3.5 volts may be obtained from sources within the system external to the threshold circuits 182 and 184.

The high threshold circuit 182 detects that the battery has been on charge, and provides a logic 1 output signal whenever the voltage measurement reaches or exceeds 3.9 volts to provide a logic 1 output signal at connection 188 to the set input of a flip-flop 190. The resulting output from flip-flop 190 at connection 192 is applied to the control base electrode of a transistor 194 to connect a recalibration resistor 196 in parallel with voltage divider resistor 50 to ground. This reduces the voltage measurement to compensate for the relatively high value of terminal voltage encountered in a quiescent period following the presence of a substantial charge current, as compared to the measured terminal voltage after a discharge current.

A discharge condition is recognized by the low threshold circuit 184 which responds to any battery terminal voltage at or below 3.5 volts to provide a logic 1 output at connection 198 to the reset terminal of flip-flop 190, causing that flip-flop to reset. This removes the recalibration connection on 192 to the transistor 194 so that the voltage measurement is in the normal mode as soon as quiescence is detected.

While it is not absolutely necessary, it may be desired to provide a shorter quiescent period prior to the taking of a voltage reading after charge, as compared to the quiescent interval after discharge. In accordance with an alternative feature of FIG. 7, this requirement is fulfilled by the provision of a fast clock 26D together with a frequency dividing counter 124D, to provide two different clock rates at 24D and 24E. After a charge condition, when flip-flop 190 is set, the logic 1 signal on connection 192 is used by an AND gate 198 to gate the fast clock pulses from connection 24E through to the OR gate 22D and thus to the counter 20. On the other hand, if the system has been on discharge, the flip-flop 190 is reset, and the resultant output on connection 200 gates the slow clock pulses at connection 24D through AND gate 202 to the OR gate 22D and thus to the counter 20. While it is not necessary, it is logical to employ different quiescent intervals respectively for after charge and after discharge conditions, since the recovery curves are somewhat different for the two cases. The voltage recalibration resistor 196 is selected to properly compensate the measured battery voltage for a particular state of charge depending upon the actual quiescent interval selected for quiescence after charge as compared to quiescence after discharge.

In all other respects, the circuit of FIG. 7 operates exactly the same as the circuit of FIG. 2, and reference is made to the description of that figure for a general understanding of the operation of the system. The fast clock signal on connection 24E, directly from clock 26D, is used at AND gate 32 to clock the operations of the bidirectional counter 36 in accomplishing the matching of the voltage output at 44 to the measured voltage by the comparison amplifier 40.

It is apparent that for voltage levels between 3.9 volts and 3.5 volts as measured at connection 186, no output is available from either of the threshold circuits 182 or 184 so that the flip-flop circuit 190 does not change state. However, whenever charging does occur, and there is any appreciable battery current, the battery terminal voltage always exceeds 39 volts so that the measured voltage at threshold circuit 182 would be above the 3.9 volt threshold. Similarly, under discharge conditions with any appreciable discharge current, the battery terminal voltage always goes below 35 volts, corresponding to the threshold of 3.5 volts at which circuit 184 provides an output. Accordingly, the circuit illustrated in FIG. 7 is a foolproof and simple means for determining and recording whether the battery has been on charge or discharge.

Figure 8:
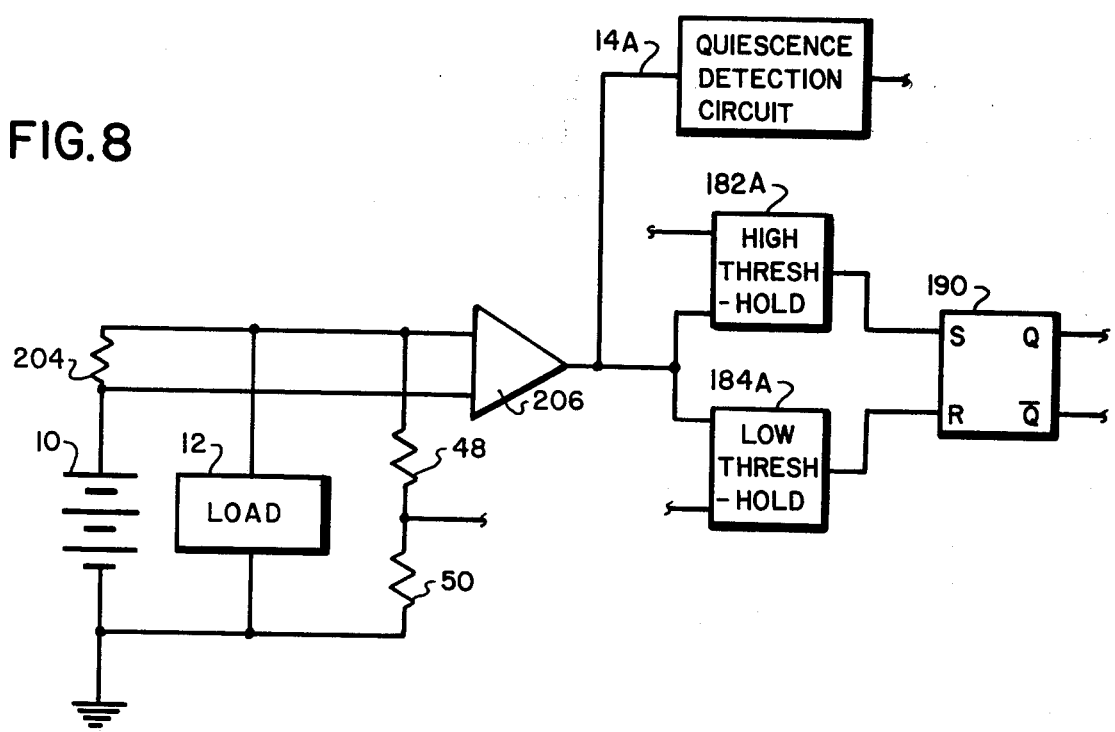
FIG. 8 is a schematic circuit diagram illustrating an alternative charge-discharge detection circuit for use in the system of FIG. 7.

FIG. 8 is a partial schematic circuit diagram showing a modified method and circuit for determining whether the battery has been in the charge or discharge mode. In this circuit, rather than detecting battery terminal voltage, current is measured by a shunt resistor 204 connected in series with the battery 10. The voltage drop across this shunt resistor changes polarity depending upon the direction of current flow through the battery 10. The voltage across the shunt resistor 204 is measured by a differential amplifier 206, and the amplified shunt voltage is detected by high threshold and low threshold circuits 182A and 184A which control the set and reset of the flip-flop 190, as before. The threshold levels to which the threshold circuits 182A and 184A operate are selected to provide actuation only when reasonably substantial currents flow through the battery in either direction. In other respects, the circuit operates in exactly the same manner as the circuit of FIG. 7.

The quiescence detection circuit 14 required by all of the systems of the present invention can be carried out in various ways, in addition to the load voltage logic illustrated in FIG. 3. For instance, the measurement of battery current can be used very conveniently to determine the condition of quiescence. For that purpose, the output from amplifier 206 of FIG. 8, which indicates a measurement of the battery current, is very useful. To illustrate this principle of operation, an alternative quiescence detection circuit 14A is shown connected to the output of amplifier 206 in FIG. 8. Other means for detecting current flow may also be used for quiescence detection, such as an electromagnetic current detection relay, a hall effect switch, or detection of a voltage drop across a semi-conductor. Also, quiescence detection can be carried out by continuously measuring the temperature of a low mass circuit component which immediately cools in the absence of battery current.

Figure 9:
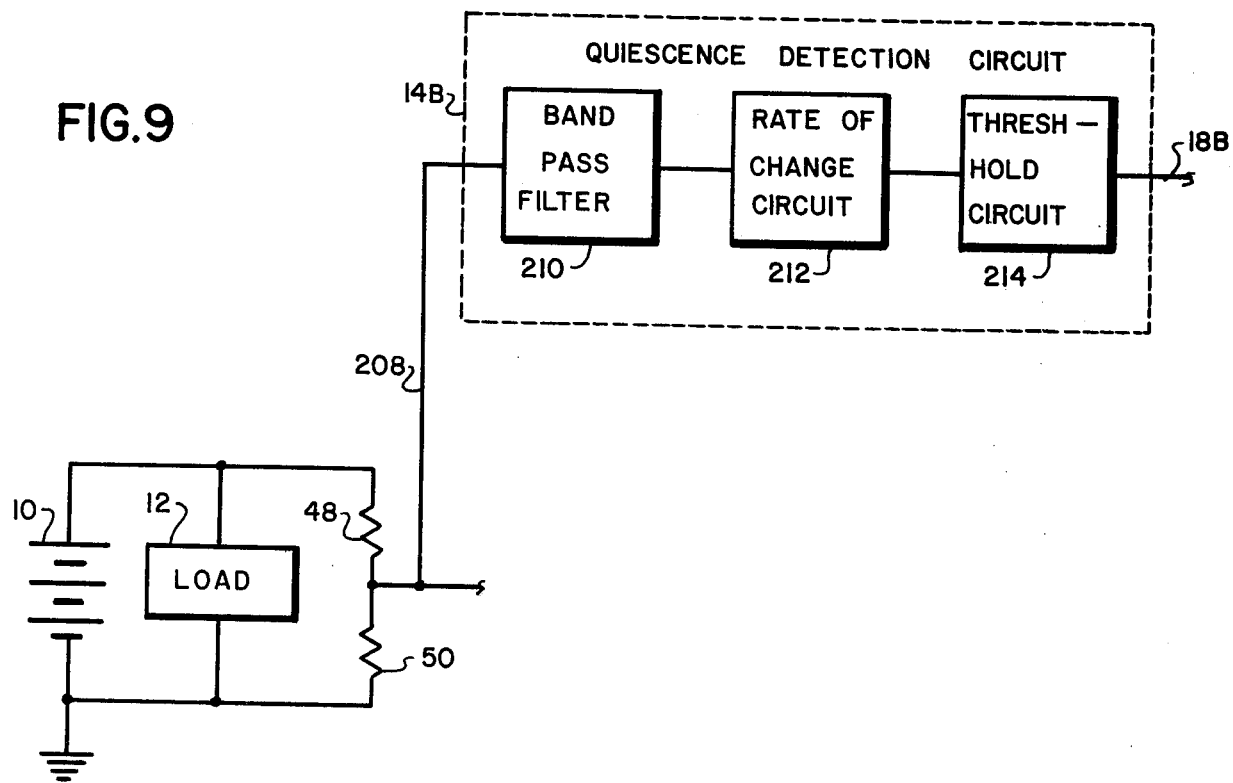
FIG. 9 is a schematic circuit diagram of a quiescence detection circuit which may be employed as an alternative to the circuit of FIG. 3.

Another extremely useful method of quiescence detection is the constant monitoring of battery terminal voltage for the presence or absence of continuous voltage changes of the type sometimes referred to as "noise" which are associated with the presence of the expected loads. For instance, if the battery loads are primarily commutator motors, the line noise typical of the operation of those motors are derived from the commutator switching, is very distinctive, and easily detected, and provides a foolproof means for detecting activity vs. quiescence. FIG. 9 illustrates a quiescence detection circuit 14B which operates on this principle.

In FIG. 9, a quiescence detection circuit of the type just described is shown connected at 208 to the divided voltage output from the voltage divider 48–50. The quiescence detection circuit 14B includes a band-pass filter 210, a rate of voltage change detection circuit 212, and a threshold circuit 214. The band-pass filter 210 is designed to pass the frequencies expected in the commutator "noise", and to thus detect the presence of activity. Those signals are further discriminated by a rate of change responsive circuit 212 and a threshold circuit 214 which passes only those signals beyond a predetermined threshold level. However, those signals which are passed, are effective on connection 18B to control the reset of the quiescent interval timing counter 20, and to keep that counter constantly reset in the presence of detected activity.

Figure 10:
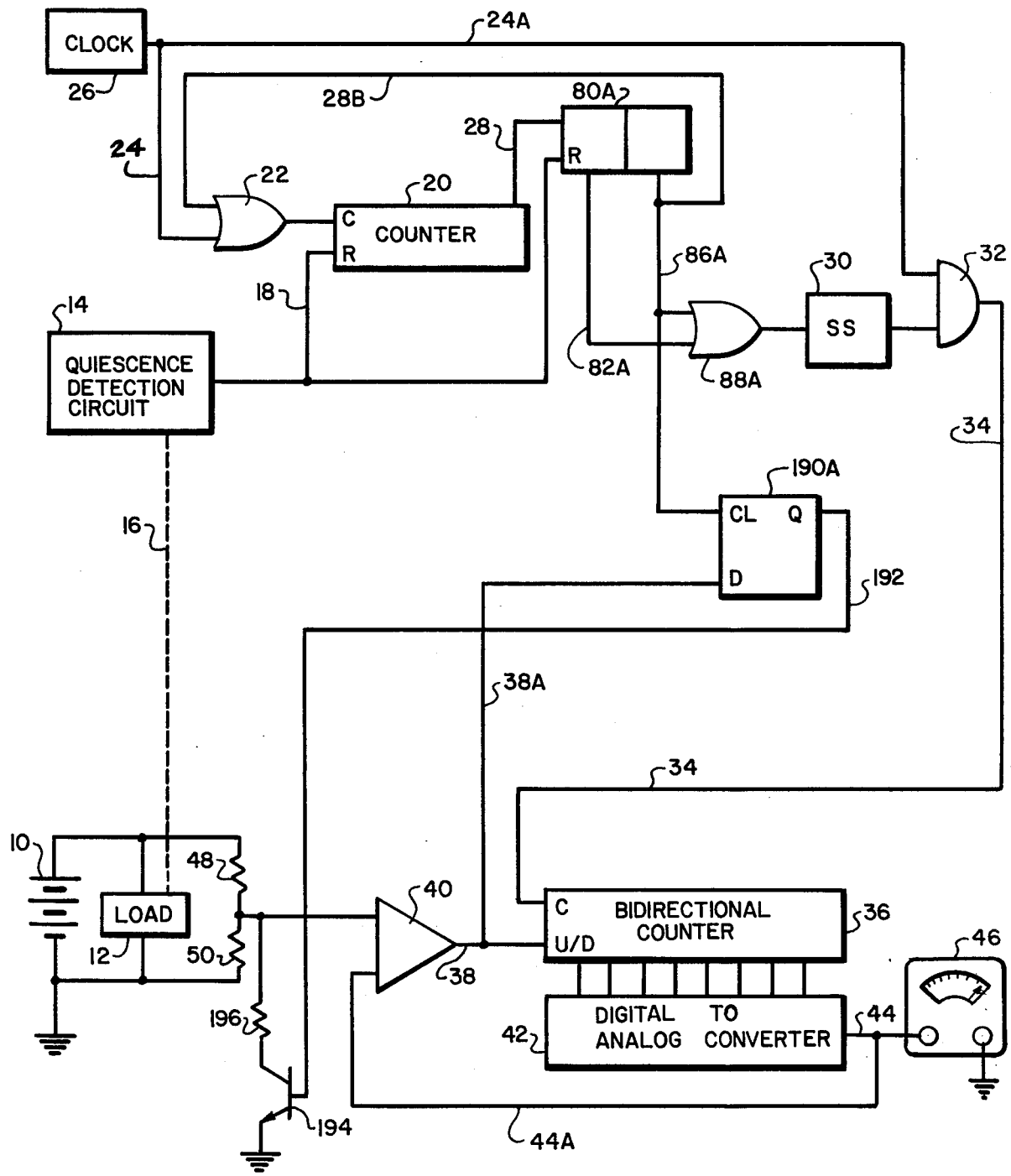
FIG. 10 is a schematic circuit diagram of a modification of the embodiment of FIG. 7 illustrating an alternative means for determining whether the battery has been in the charge or discharge mode.

FIG. 10 is a modification of the system of FIG. 7 illustrating still another method and circuit for determining whether the battery has been in the charge or discharge mode. FIG. 10 includes some hardware features from the prior FIG. 4 in the form of a two stage shift register 80A, and an OR gate 88A which is connected for operation in response to either of the outputs from either of the shift register stages at connections 82A and 86A. Virtually all of the elements illustrated in FIG. 10 have been previously illustrated in prior figures, and the operation has been described in connection with those figures. Thus, FIG. 10 is really very much like FIG. 2 and FIG. 7, and operates very similarly to FIG. 7 except for the presence of the shift register 80A, the OR gate 88A, the flip-flop 190A (which replaces flip-flop 190).

Very briefly stated, the circuit of FIG. 10 measures the battery terminal voltage at two points in time after quiescence, as determined by the respective outputs from the shift register stages of shift register 80A. The flip-flop 190A is set to recalibrate the voltage divider 48–50 by switching the resistor 196 into the circuit if the second voltage which is measured is less than the first voltage, thus indicating a voltage decay from a charge condition rather than a voltage recovery from a discharge condition. Thus, the circuit of FIG. 10 detects the direction of the slope of the voltage recovery curve, and in that manner determines whether it is a charge recovery or a discharge recovery.

The operation of the FIG. 10 circuit is described more fully as follows. When the quiescence detection circuit 14 detects quiescence, the reset signal is removed from the counter 20 and also from the shift register 80A. The pulses from clock 26 then operate through OR gate 22 to count the counter 22 up to time out a first quiescent interval. At the end of that interval, a signal on connection 28 energizes the first stage of shift register 80A, causing an output on connection 82A to OR gate 88A which begins the timed interval of the single shot circuit 30. The interval of that signal opens the AND gate 32 to provide clock pulses on connection 34 to the bidirectional counter 36 to respond to the up or down signal from comparison circuit 40 on connection 38 to count either up or down so as to match the count stored in counter 36 with the battery terminal voltage as detected at the voltage divider 48–50.

Meanwhile, the counter 20 continues to count around to zero and back up again to provide a second output on connection 28 which causes the register 80 to shift to the next position, providing an output on connection 86A. That signal locks out further clock pulses to counter 20 through connection 28B. The 86A signal is also supplied to the OR gate 88A, and to the clock or trigger input of a triggered flip-flop 190A. The data input D to the flip-flop 190A is provided from connection 38A connected to the output 38 of the comparison amplifier 40. At the instant when the trigger signal on connection 86A becomes available to the trigger input of flip-flop 190A, the terminal voltage of the battery, as detected by voltage divider 48–50 will have either increased or decreased from the previously measured value which is continuously indicated to the comparison amplifier 40 by means of the connection 44A from the output of the digital to analog converter 42. If the measured battery terminal voltage is lower than the previously measured voltage, the output from the comparison amplifier 40 appearing on connection 38A appears as a logic 1 at the data input terminal of flip-flop 190A, causing that flip-flop to be placed into the set state. This provide a logic 1 output on connection 192 from flip-flop 190A which switches on the semi-conductor 194 to connect the compensating resistor 196 into the voltage divider 48–40. The connection of that resistor compensates the operation of the circuit for the measurement of voltage recovery from the charge state, rather than from the discharge state. On the other hand, if the voltage detected by voltage comparison amplifier 40 from the voltage divider 48–50 at the second time interval determined by the second stage of the shift register 80A is greater than the previous voltage measurement, the flip-flop 190A is not set, and if previously in the set state will be reset, thus preventing the connection of the compensating resistor 196 by the semi-conductor 194.

The triggering of the flip-flop 190A by the signal at 86A from register 80A does not interfere with the subsequent operation of the bidirectional counter 36 in response to the timed interval of clock pulses provided by the single shot circuit 30 and the gate 32 to permit a balancing of the bidirectional counter 36 and the output of the digital to analog converter 42 with the battery terminal voltage as measured at the voltage divider 48–50.

All of the drawing FIGS. 2 through 10 are schematic in nature, and it will be understood that they are intended to portray the general principles involved. In actual physical embodiments, it will be understood that additional start up sequencing circuitry may be required, as well as additional logic gates to promote reliability and to prevent undesired back circuits.

The invention has been implemented in the circuits of FIGS. 2 through 10 employing combinations of digital and analog techniques. However, it will be apparent that either digital or analog techniques may be used more extensively, to make the circits substantially completely digital, or completely analog in structure and function.

The system schematics shown in FIGS. 4, 5, 6, and 7, each generally illustrate a number of alternative features which can be employed in practicing the present invention. The combination of features shown in each schematic was selected arbitrarily, and presentation of all of the features in a single schematic was intentionally avoided in order to make the presentation clearer. However, it will be understood that many of the features are individual alternative features which can be combined together in combinations different from the combinations presented in these system schematics without departing from the basic spirit and scope of the invention.

FIG. 6 illustrated the principle that it is desirable to promote the accuracy of the quiescent state of charge circuit by providing for a minimum interval of activity before a quiescent voltage reading is taken. Similarly, it is also desirable to promote accuracy by somehow assuring that a quiescent voltage reading is not taken unless there has been a battery current of substantial amplitude in the interval immediately prior to the quiescent interval. Thus, for instance, when the invention is applied to a battery operated fork lift truck, the system may preferably be interlocked so that a quiescent voltage reading is taken only after the energization of the lift motor, which is the biggest load.

The present invention is especially useful for application to battery powered apparatus where the occurrence of frequent quiescent periods is highly predictable. Thus for instance, the invention is especially useful with golf carts, where the golfer typically stops his cart frequently to play.

The invention has been described with special reference to lead-acid batteries. However, the principles of the invention are applicable to other rechargeable battery types such as nickel-iron batteries, as well as to primary cells such as lithium batteries.

The basic principle of the present invention is to make effective use of the voltage recovery characteristics of baterries after an interval of current flow, as illustrated in FIG. 1, to derive or predict the ultimate open circuit voltage, and to thus accurately indicate the state of charge of the battery. The preceding portions of the disclosure relate primarily to one approach in making use of those voltage recovery curves which involves measuring a fixed quiescent interval of time after current flow, and then taking a rapid voltage measurement at the end of that quiescent interval. Also, the alternative of taking several different voltage readings at successive fixed intervals is disclosed in connection with FIG. 4. However, it will be apparent that the principles can be carried out also in other alternative modes. For instance, a voltage reading can be taken at some arbitrary time after quiescence together with a measurement of the quiescent interval time. Thus, a timer may be employed to continue the timing of the quiescent interval, and to provide a signal indicative of the elapsed quiescent interval time whenever a voltage reading is to be taken. The system is then designed to analyze the combination of the measured voltage and the quiescent interval in relation to the characteristics illustrated in FIG. 1 to derive an indication of the state of charge in terms of a predicted ultimate open circuit battery voltage.

Another alternative approach not specifically disclosed above is to determine the quiescent interval, and the operating position on the voltage recovery curve, by taking several successive voltage readings and timing the spacing between those readings and comparing those readings to derive a voltage characteristic slope. The information about the voltage characteristic slope together with the absolute voltage value reading provides a basis for determining the precise position which the readings represent upon the voltage recovery characteristics illustrated in FIG. 1. By this means, it is possible to again predict the ultimate open circuit battery voltage as a basis for indicating the battery state of charge. This may be referred to as a voltage derivative battery tester. Circuitry similar to that of FIG. 10 may be employed in carrying out this method.

Both of the above mentioned alternative approaches are expeditiously implemented by digital circuitry which is capable of calculating slopes from a succession of two or more voltage measurements, and which is capable of storing and relating voltage recovery characteristic data, such as illustrated in FIG. 1, with actual voltage measurements.

In any such system, it is necessary to know whether the last preceding current was a charge current or a discharge current. However, in many applications, that will be known, or can be reasonably assumed to be one way or the other without testing. As previously mentioned, however, the absolute voltage level will generally provide such information. With the voltage derivative battery tester, however, the direction of the voltage slope gives an unambiguous indication of prior charge or discharge status. This principle was discussed above in connection with FIG. 10.

While this invention has been shown and described in connection with particular preferred embodiments, various alterations and modifications will occur to those skilled in the art. Accordingly, the following claims are intended to define the valid scope of this invention over the prior art, and to cover all changes and modifications falling within the true spirit and valid scope of this invention.

I claim:

1. A method for indicating the state of charge of batteries in an electrical power system of the type in which charged batteries are discharged through a load during a discharge cycle and wherein
   the discharge cycle includes quiescent intervals,
   the method including the steps of detecting a quiescent condition with substantially no current flow through the battery,
   precisely timing each quiescent condition for a predetermined interval of at least one tenth of a minute, and then taking a measurement of the battery terminal voltage at the end of the time interval to provide as indication of the battery charge condition which is a function of the voltage and a function of the time interval.

2. A method as claimed in claim 1 wherein
   the quiescent intervals which are timed for the purpose of taking a voltage measurement are exclusively quiescent intervals during a discharge cycle.

3. A method as claimed in claim 1 wherein
   the measurement of battery terminal voltage is limited to a brief time window so that the voltage measurement is limited to a sample voltage available during that time window,
   and wherein
   the voltage sample value is stored for continuous display until the next measurement.

4. A method as claimed in claim 3 wherein
   additional voltage measurements are taken at successive intervals while the quiescent condition continues,
   each successive voltage measurement being modified to compensate for the continuing recovery of the battery terminal voltage.

5. A method as claimed in claim 3 wherein
   a temperature measurement indicative of battery temperature is taken and the measurement of battery terminal voltage is modified by a factor based upon the temperature measurement to compensate for the modification of the battery terminal voltage by reason of temperature changes.

6. A method as claimed in claim 5 wherein
   the voltage measurement is modified in response to temperature changes by a temperature responsive variation in the predetermined interval of time so that the voltage measurement is taken at different points in the voltage recovery of the battery terminal voltage.

7. A method as claimed in claim 3 wherein
   each charge cycle of the battery includes at least one quiescent interval,
   and wherein
   the measurement of battery terminal voltage is taken after a quiescent interval of predetermined duration during a charge cycle as well as during a discharge cycle.

8. A battery state of charge indicator system for monitoring the condition of electrical storage batteries in an electrical power system of the type in which charged batteries are discharged during a discharge cycle to supply a variable load and then recharged in a charge cycle and in which before beginning a new discharge cycle, and in which,
   the discharge cycle includes a plurality of quiescent intervals,
   said indicator system including means for detecting the quiescent condition when there is substantially no current flow through the batteries,
   a timing means connected to said quiescent condition detecting means and operable to begin timing a predetermind interval of at least one tenth of a minute each time the beginning of the quiescent condition is detected,
   said quiescent condition detecting means being operable to reset said timer upon the interruption of the quiescent condition,
   said quiescent condition detecting means being operable to cause said timing means to continue timing said interval while the quiescent condition continues until the timing of said interval is completed,
   a voltage sample and storage means connected to said timing means and arranged to be connected to measure the terminal voltage of at least one of the batteries in the power system being monitored,
   said timing means being operable upon the completion of the timing of said interval to actuate said sample and storage means,
   said sample and storage means being operable upon such actuation to take a measurement of the battery terminal voltage to provide an indication of the battery charge condition which is a function of the voltage and a function of the time interval.

9. A state of charge indicator system as claimed in claim 8 wherein
   said sample and storage means is operable to take the measurement of the battery terminal voltage only during a very limited time interval and to then discontinue that measurement.

10. A state of charge indicator system as claimed in claim 8 wherein
said sample and storage means is operable upon actuation by said timing means to take a continuing measurement of the battery terminal voltage during the continuation of quiescence to provide a continuing update of the battery terminal voltage reading,
said system also including means to modify said battery terminal voltage measurement to compensate for the continuing change on the battery terminal voltage as a function of the length of the quiescent interval.

11. A state of charge indicator system as claimed in claim 10 wherein
said sample and storage means is operable to take the continuing voltage measurements by taking a series of individual voltage measurements at spaced time intervals to provide individual voltage samples at said intervals.

12. A state of charge indicator system as claimed in claim 8 including
a temperature responsive means operable to respond to a temperature indicative of the temperature of the battery,
said temperature responsive means being connected and arranged to modify the voltage measurement of the battery terminal voltage by said sample and storage means to compensate for modification of the terminal voltage caused by temperature changes.

13. A state of charge indicator system as claimed in claim 12 wherein
said temperature responsive means is operable to directly modify the voltage measurement by said sample and hold means.

14. A state of charge indicator system as claimed in claim 12 wherein
said temperature responsive means is connected to said timing means and is operable to vary the length of said predetermined time interval in response to temperature variations so as to compensate the measurement of battery terminal voltage in response to temperature by taking the voltage measurement at varying points in the voltage recovery.

15. A state of charge indicator system as claimed in claim 9 wherein
said timing means comprises a digital counter timer together with a system clock for timing the counter operation of said timer,
the timer counter being operable to produce a predetermined digital output signal at the end of the timing interval.

16. A state of charge indicator system as claimed in claim 15 wherein
said sample and storage means comprises a digital storage means for storing a number corresponding to the measurement of the battery terminal voltage,
said digital storage means comprising a digital counter,
said sample and storage means also including a digital-to-analog converter and a voltage comparison means connected to the output of said digital-to-analog converter and also arranged for connection to said battery to compare the output voltage from said digital-to-analog converter with the voltage from said battery and to control the operation of said counter to stop the counting operation of said counter when the output of said digital-to-analog converter matches the battery terminal voltage,
said sample and storage means also including an operable connection to said clock through a gating means which is operated in response to said timing means to provide for operation of said storage counter only after completion of said timed interval,
the output of said digital-to-analog converter being connected to a voltage indicating device for thus indicating the state of charge of the batteries.

17. A state of charge indicator system as claimed in claim 16 wherein
said storage counter is gated to a clock which operates at a higher frequency than the system clock used for said timing means.

18. A state of charge indicator system as claimed in claim 9 wherein
there is provided a low pass filter connected between the terminals of the battery and said sample and storage means so that the measurement is a measurement of the filtered battery terminal voltage.

19. A state of charge indicator system as claimed in claim 9 wherein
said sample and storage means is operable when the battery terminal voltage exceeds a predetermined maximum value to measure and store only that predetermined maximum value.

20. A state of charge indicator system as claimed in claim 9 wherein
a separate output register is provided,
and wherein
said system is operable to transfer the measurement of the battery terminal voltage stored in said storage counter to said output register only upon the completion of the voltage measurement.

21. A state of charge indicator system as claimed in claim 9 wherein
a second timing means is connected to said quiescent condition detecting means and operable to begin timing a predetermined interval each time the beginning of a non-quiescent condition is detected,
a gating means connected to said second timing means and operable to gate on in response to a signal from said second timing means after a predetermined interval of non-quiescence,
said gating means being connected to said first mentioned timing means and being operable to enable said first mentioned timing means to permit the measurement of the battery terminal voltage only after a non-quiescent period sufficient to complete the time interval determined by said second timing means plus a quiescent time interval determined by said first mentioned timing means.

22. A state of charge indicator system as claimed in claim 9 for use in an electric power system of the type in which each charge cycle includes at least one quiescent interval,
said state of charge indicator system being operable to measure the battery terminal voltage as an indication of the battery charge condition after a quiescent interval in a charge cycle as well as in a discharge cycle,
said system including means for determining whether the electrical power system is in a charge cycle or in a charge cycle, and means connected to said cycle determining means for changing the calibration of said sample and storage means depending on whether the electrical power system is in the charge or discharge mode to reflect the difference in battery terminal voltage expected during quiescent intervals respectively during charge and discharge cycles.

23. A state of charge indicator system as claimed in claim 22 wherein
said charge or discharge cycle detection means is operable to modify the operation of said timing means to provide for one time interval before the actuation of said sample and storage means when the electrical power system has been in the charge cycle and to permit another time interval of quiescence before actuation of said sample and storage means when the electrical power system is in the discharge cycle.

24. A state of charge indicator system as claimed in claim 22 wherein
said charge-discharge determining means comprises means for monitoring the battery terminal voltage and operable above a predetermined voltage threshold to indicate a charge mode and operable below a predetermined voltage threshold to indicate a discharge mode.

25. A state of charge indicator system as claimed in claim 22 wherein
said charge-discharge determining means comprises means for detecting the direction of current flow through said battery.

26. A state of charge indicator system as claimed in claim 9 wherein
a separate means is provided for measurements during non-quiescent periods to provide an indication of battery state of charge.

27. A state of charge indicator system as claimed in claim 9 wherein
said quiescence detection means comprises means for detecting voltages on each of the separate major load devices of the electrical power system together with logic gating means for providing a quiescence signal only when the absence of voltages on all of said loads is detected.

28. A state of charge indicator system as claimed in claim 9 wherein
said quiescence detection means comprises a line noise detector operable to detect disturbances in the voltage at the battery terminals which are characteristic of the presence of load,
said line noise detector being capable of detecting the absence of load on the basis of absence of the line noise.

29. A method for indicating the state of charge of a battery in an electrical power system of the type in which a charged battery is discharged through a load during a discharge cycle, the method including the following steps carried out during a quiescent interval with substantially no current flow through the battery, determining the quiescent time interval since the last substantial current flow through the battery when such interval is a minimum of one tenth of a minute, taking a rapid measurement of battery terminal voltage, and relating the combination of the time interval and voltage measurements to known battery open circuit voltage recovery characteristics to provide an indication of the state of charge of the battery.

30. A method as claimed in claim 29 wherein
the determination of the quiescent time interval is carried out by taking the rapid measurement of battery terminal voltage at a fixed predetermined quiescent time interval after the last substantial current flow through the battery.

31. A method as claimed in claim 29 wherein
the determination of the quiescent time interval is carried out by timing and recording a variable quiescent time interval until the time when the rapid measurement of battery terminal voltage is taken.

32. A method as claimed in claim 29 wherein
the determination of the quiescent time interval is carried out by taking at least two successive voltage measurements and timing the spacing between those voltage measurements and by determining the slope of the voltage curve represented by those successive voltage measurements and then relating the slope represented by those voltage measurements to known battery open circuit voltage recovery characteristics.

33. A method as claimed in any one of the preceding claims 29 through 32 wherein
a determination is made as to whether the last active state of the battery was a charge state or a discharge state.

* * * * *

UNITED STATES PATENT AND TRADEMARK OFFICE
CERTIFICATE OF CORRECTION

PATENT NO.   : 4,460,870
DATED        : July 17, 1984
INVENTOR(S)  : EUGENE P. FINGER It is certified that error appears in the above-identified patent and that said Letters Patent are hereby corrected as shown below:

Column 8, line 31,   "connection 82," should read --connection 84,--.

Column 17, line 11,  "minimum of interval" should read --minimum interval--.

Column 20, line 65,  "counter 22" should read --counter 20--.

Column 23, line 53,  "as indication" should read --an indication--.

Column 24, line 43,  "predetermind" should read --predetermined--.

Signed and Sealed this

Nineteenth Day of March 1985

[SEAL]

Attest:

DONALD J. QUIGG

Attesting Officer

Acting Commissioner of Patents and Trademarks